(12) United States Patent
Suzuki et al.

(10) Patent No.: US 6,797,450 B2
(45) Date of Patent: Sep. 28, 2004

(54) RADIATION-SENSITIVE COMPOSITION, INSULATING FILM AND ORGANIC EL DISPLAY ELEMENT

(75) Inventors: Masayoshi Suzuki, Tokyo (JP); Hirofumi Sasaki, Tokyo (JP); Isao Nishimura, Tokyo (JP); Fumiko Yonezawa, Tokyo (JP); Masayuki Endo, Tokyo (JP); Kazuaki Niwa, Tokyo (JP)

(73) Assignee: JSR Corporation, Tokyo (JP)

( * ) Notice: Subject to any disclaimer, the term of this patent is extended or adjusted under 35 U.S.C. 154(b) by 125 days.

(21) Appl. No.: 10/089,154

(22) PCT Filed: Jul. 26, 2001

(86) PCT No.: PCT/JP01/06425

§ 371 (c)(1),
(2), (4) Date: Mar. 27, 2002

(87) PCT Pub. No.: WO02/10859

PCT Pub. Date: Feb. 7, 2002

(65) Prior Publication Data

US 2003/0054284 A1 Mar. 20, 2003

(30) Foreign Application Priority Data

| Jul. 27, 2000 | (JP) | 2000-226468 |
| Dec. 5, 2000 | (JP) | 2000-370381 |
| Dec. 14, 2000 | (JP) | 2000-379680 |

(51) Int. Cl.$^7$ .............................................. G03F 7/023
(52) U.S. Cl. ...................... 430/166; 430/191; 430/192; 430/193; 430/321
(58) Field of Search ...................... 430/165, 192, 430/193, 166, 191; 433/191

(56) References Cited

U.S. PATENT DOCUMENTS 5,399,456 A * 3/1995 Spak et al. ............... 430/165
5,432,039 A * 7/1995 Shimokawa et al. ...... 430/191

(List continued on next page.)

FOREIGN PATENT DOCUMENTS

| JP | 59-184337 | 10/1984 |
| JP | 2-84654 | 3/1990 |
| JP | 10-270173 | 10/1998 |
| JP | 11-52560 | 2/1999 |
| JP | 11-233259 | 8/1999 |

OTHER PUBLICATIONS

Jaromir Kosar Light–Sensitive Systems: Chemistry and Application of Nonsilver Halide Photographic Processes, John Wiley & Sons, Inc., New York, pp. 339–353, 1965.
W.S. DeForest, Photoresist, McGraw–Hill Book Company, New York, p. 50, 1975.

Primary Examiner—John S. Chu
(74) Attorney, Agent, or Firm—Oblon, Spivak, McClelland, Maier & Neustadt, P.C.

(57) ABSTRACT

According to the present invention, there are provided an insulating film for an organic EL element, which has sufficiently low water permeability and a good sectional form and whose reactivity with a basic material and an electrode made from a metal having a low work function is suppressed, an insulating film for an organic EL element, which enables the formation of a through hole or U-shaped cavity therein and has excellent flattening performance, high transparency and high resistance to a resist stripper, and a radiation sensitive resin composition for forming the insulating film.

An organic EL display element having this insulating film is free from an emission failure and has sufficiently long luminance half-life period and excellent reliability.

The above composition comprises an alkali-soluble resin which may have an epoxy group and a 1,2-quinonediazide compound.

26 Claims, 1 Drawing Sheet a b

U.S. PATENT DOCUMENTS

| | | |
|---|---|---|
| 5,518,860 A | 5/1996 | Niikura et al. |
| 5,691,101 A * | 11/1997 | Ushirogouchi et al. ..... 430/176 |
| 5,985,507 A * | 11/1999 | Blakeney et al. ........... 430/190 |
| 6,168,908 B1 | 1/2001 | Suzuki et al. ............... 430/325 |
| 6,399,267 B1 * | 6/2002 | Nishimura et al. ......... 430/192 |
| 6,440,632 B2 * | 8/2002 | Yasuda ....................... 430/196 |
| 6,537,719 B1 * | 3/2003 | Takahashi ................... 430/191 |
| 6,696,112 B2 * | 2/2004 | Okuda et al. ................ 428/1.1 |

* cited by examiner

FIG. 1 a b

RADIATION-SENSITIVE COMPOSITION, INSULATING FILM AND ORGANIC EL DISPLAY ELEMENT

FIELD OF THE INVENTION

The present invention relates to a radiation sensitive resin composition, an insulating film made therefrom and an organic EL display element comprising the insulating film. More specifically, it relates to a positive type radiation sensitive resin composition suitable for the formation of an insulating film using radiation such as ultraviolet ray, deep ultraviolet ray, X-ray, electron beam, molecular beam, γ-ray, synchrotron radiation or proton beam, an insulating film made therefrom and an organic EL display element comprising the insulating film.

PRIOR ART

Compared with liquid crystal display elements, organic EL elements have various advantages such as no dependence upon view angle as they emit light themselves, as well as excellent impact resistance, low voltage drive, low power consumption and high operational stability at low temperatures as they are solid elements. Passive type organic EL elements have the advantage of low cost since they are simple matrix elements. Owing to these advantages, the organic EL elements are highly expected to be used for mobile applications such as portable terminals and car equipment, and active studies on these organic EL elements are now under way.

The production of the above organic EL elements is generally carried out by the following method. A transparent electrode (hole injection electrode) made from, for example, tin doped indium oxide (ITO) and a hole transport layer pattern are formed on a substrate. In the case of a passive type organic EL element, after an insulating film pattern and a cathode partition pattern are formed, organic EL layer, electron transport layer and cathode are patterned by deposition. In the case of an active type organic EL element, after an ITO pattern and a hole transport layer pattern are formed, an insulating layer pattern which will become partitions for the organic EL layer is formed, followed by the formation of an organic EL layer pattern by a masking method and the formation of electron transport layer and cathode patterns.

The organic EL layer is generally made from a material formed by doping a base material such as $Alq_3$ or $BeBq_3$ with quinacridone or coumarin and the cathode is generally made from a material essentially composed of a metal having a low work function such as Mg or Ag.

The insulating film material is generally an acrylic material having alkali developability or a polyimide material having organic developability. However, the following problem is encountered in this case.

The hole transport layer, organic EL layer and electron transport layer are often made from a basic material such as an amine-based material to suitably transport holes or electrons. However, this material readily undergoes a structural change due to a trace amount of water and deterioration by an organic substance. Therefore, when the water permeability of an insulating film material is large or the residue after development exists at the time of forming an insulating film pattern, a phenomenon such as the spread of a non-emitting portion (dark area) occurs. Since a cathode essentially composed of a metal having a low work function is readily oxidized, a similar problem arises.

Particularly in the case of a passive type organic EL element, a portion made from the basic material is in direct contact with an insulating film. As this insulating film must have alkali developability or organic developability, it shows the acidity of carboxylic acid or phenol and reacts with the above basic material through water on the contact surface, or water changes the structure of the insulating film directly. When the water permeability of the insulating film is large, the insulating film promotes corrosion by an acid. A cathode essentially composed of a metal having a low work function is corroded through its reaction with an acid, thereby forming a dark spot (non-luminous spot).

When the angle (tapered angle) formed by the bottom side and the tangent of the edge portion of the sectional form of the formed insulating film is large, an organic EL layer formed by deposition may crack, whereby water enters from the crack to cause an emission failure.

Further, an insulating film made from a conventionally known material does not have sufficient resistance to a resist remover which is used to form a cathode for a passive type organic EL element, thereby making it impossible to produce an organic EL display element stably.

An insulating film material which can solve the above problems has not been proposed yet and it has been impossible to produce an organic EL element having sufficiently long service life stably.

Meanwhile, an organic EL display element having a high aperture for high definition is now under study. This organic EL element is produced by the following method, for example.

A drive terminal is formed on a substrate such as a glass substrate and an insulating film having flattening performance is formed on the terminal. A transparent electrode (hole injection electrode) pattern made from ITO, for example, is formed on the insulating film. The pattern is generally formed by wet etching.

A hole transport layer, organic EL layer, electron transport layer and electron injection electrode are then formed on the pattern sequentially.

A 1 to 15 μm through hole or a U-shaped cavity must be formed in the insulating film used in the organic EL display element having the above structure to communicate the ITO electrode (hole injection electrode) formed above the insulating film with the drive terminal below the insulating film. The insulating film must have excellent flattening performance, high transparency and high resistance to a resist remover.

However, a material capable of forming an insulating film having such high resolution that the above through hole or U-shaped cavity can be formed therein, excellent flattening performance, high transparency and high resistance to a resist remover has not been proposed yet.

SUMMARY OF THE INVENTION

It is an object of the present invention to provide a radiation sensitive resin composition for forming an insulating film which enables the stable production of an organic EL element having long service life.

It is another object of the present invention to provide a radiation sensitive resin composition for forming an insulating film which enables the formation of a through hole or U-shaped cavity therein and has excellent flattening performance, high transparency and high resistance to a resist remover.

It is still another object of the present invention to provide an insulating film formed from the above radiation sensitive resin composition.

It is a further object of the present invention to provide an organic EL element comprising the above insulating film.

Other objects and advantages of the present invention will become apparent from the following description.

According to the present invention, firstly, the above objects and advantages of the present invention are attained by a radiation sensitive resin composition (may be referred to as "first composition" hereinafter), comprising:

(1) (a) an alkali-soluble resin having no epoxy group, and (b) a 1,2-quinonediazide compound, and (2) being for forming an insulating film for an organic EL display element.

According to the present invention, secondly, the above objects and advantages of the present invention are attained by a radiation sensitive resin composition, comprising:

(1) (a') an alkali-soluble resin having an epoxy group, and (b) a 1,2-quinonediazide compound, and (2) being for forming an insulating film for an organic EL display element.

According to the present invention, thirdly, the above objects and advantages of the present invention are attained by an insulating film for an organic EL display element, which is formed from the above first composition or the above second composition of the present invention.

According to the present invention, fourthly, the above objects and advantages of the present invention are attained by an organic EL display element comprising an insulating film formed from the above first composition or the above second composition of the present invention.

DETAILED DESCRIPTION OF THE PREFERRED EMBODIMENTS

The present invention will be described hereinbelow. A description is first given of the first composition. The first composition comprises an alkali-soluble resin having no epoxy group (a) and a 1,2-quinonediazide compound (b).

The alkali-soluble resin having no epoxy group (a) is preferably a novolak resin having no epoxy group (to be simply referred to as "novolak resin" hereinafter) or a polymer of an unsaturated monomer having an acid group such as a carboxyl group or phenolic hydroxyl group.

Novolak Resin

The novolak resin used in the present invention is obtained by polycondensing a phenol with an aldehyde in the presence of an acid catalyst. Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 3,4-xylenol, 3,5-xylenol, 2,3,5-trimethylphenol, 3,4,5-trimethylphenol, p-phenylphenol, hydroquinone, catechol, resorcinol, 2-methylresorcinol, pyrogallol, α-naphthol, β-naphthol, bisphenol A, dihydroxybenzoic acid ester, gallic acid ester, o-nitrophenol, m-nitrophenol, p-nitrophenol, o-chlorophenol, m-chlorophenol and p-chlorophenol. Out of these compounds, o-cresol, m-cresol, p-cresol, 2,3-xylenol, 2,4-xylenol, 2,5-xylenol, 2,3,5-trimethylphenol, resorcinol and 2-methylresorcinol are preferred. These phenols may be used alone or in combination of two or more.

Examples of the aldehyde to be polycondensed with the above phenol include formaldehyde, paraformaldehyde, benzaldehyde, acetaldehyde, propylaldehyde, phenylaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, o-ethylbenzaldehyde, m-ethylbenzaldehyde, p-ethylbenzaldehyde, p-n-butylaldehyde, furfural, 1-naphthoaldehyde, 2-naphthoaldehyde and 2-hydroxy-1-naphthoaldehyde. Trioxane which forms an aldehyde during a reaction may also be used as the above aldehyde. Out of these, formaldehyde is particularly preferred. The above aldehydes and compound forming an aldehyde may be used alone or in combination of two or more. The aldehyde is used in an amount of preferably 0.7 to 3 mols, more preferably 0.7 to 2 mols based on 1 mol of the phenol.

Examples of the acid catalyst include hydrochloric acid, nitric acid, sulfuric acid, p-toluenesulfonic acid, formic acid, acetic acid and oxalic acid. The amount of the acid catalyst is preferably $1 \times 10^{-4}$ to $5 \times 10^{-1}$ mol based on 1 mol of the phenol.

Water is preferably used as a reaction medium for a polycondensation reaction. However, when the phenol used in the polycondensation reaction does not dissolve in an aqueous solution of an aldehyde and a heterogeneous system is thereby formed in the initial stage of the reaction, a hydrophilic organic solvent may be used as a reaction medium. Examples of the solvent used in this case include alcohols such as methanol, ethanol and butanol; and cyclic ethers such as tetrahydrofuran and dioxane. The amount of the reaction medium is preferably 20 to 100 parts by weight based on 100 parts by weight of the total of the reaction raw materials.

The condensation reaction temperature can be suitably adjusted according to the reactivity of each of the reaction raw materials. It is preferably 10 to 200° C. After the end of the polycondensation reaction, the temperature is suitably elevated to 130 to 230° C. to remove an unreacted raw material, catalyst and reaction medium remaining in the system, thereby making it possible to distill off volatile matter under reduced pressure and to collect the novolak resin. At this point, the novolak resin may be collected after the reaction mixture obtained after the polycondensation reaction is washed with a suitable solvent as required.

The weight average molecular weigh in terms of polystyrene (to be referred to as "Mw" hereinafter) of the novolak resin is preferably 2,000 to 20,000, more preferably 3,000 to 15,000. When Mw is larger than 20,000, it may be difficult to apply the composition to a wafer uniformly, and developability and sensitivity may deteriorate. When Mw is smaller than 2,000, not only a portion exposed to radiation but also a portion unexposed to radiation have solubility in a developer in the developing step to be described hereinafter, whereby a pattern may not be formed.

Polymer of an Unsaturated Monomer having an Acid Group

The unsaturated monomer having an acid group is preferably an unsaturated carboxylic acid, unsaturated carboxylic anhydride or unsaturated monomer containing a phenolic hydroxyl group. They may be used alone or in combination of two or more.

The polymer may be a polymer or copolymer of the above unsaturated monomer or a copolymer of the above unsaturated monomer and another olefinic unsaturated monomer.

Examples of the unsaturated carboxylic acid and unsaturated carboxylic anhydride include o-vinylbenzoic acid, m-vinylbenzoic aid, p-vinylbenzoic acid, and alkyl, alkoxyl, halogen, nitro, cyano, amide and ester substituted products thereof; methacrylic acid, acrylic acid, and α-position substituted products obtained by substituting the α-position thereof by a haloalkyl, alkoxyl, halogen, nitro or cyano group; and unsaturated dicarboxylic acids such as maleic acid, maleic anhydride, fumaric acid, fumaric anhydride, citraconic acid, mesaconic acid, itaconic acid and 1,4-cyclohexenedicarboxylic acid, and half esters obtained by substituting one of the carboxyl groups thereof by a methyl, ethyl, propyl, i-propyl, n-butyl, sec-butyl, ter-butyl, phenyl, o-toluyl, m-toluyl or p-toluyl ester group, and half amides obtained by substituting one of the carboxyl groups thereof by an amide group.

Examples of the unsaturated monomer containing a phenolic hydroxyl group include o-hydroxystyrene, m-hydroxystyrene, p-hydroxystyrene, and alkyl, alkoxyl, halogen, haloalkyl, nitro, cyano, amide, ester and carboxyl substituted products thereof; and polyhydroxyvinylphenols such as vinylhydroquinone, 5-vinylpyrogallol, 6-vinylpyrogallol and 1-vinylphloroglucinol.

Out of these unsaturated monomers having an acid group, m-hydroxystyrene, p-hydroxystyrene, acrylic acid, methacrylic acid, maleic acid, maleic anhydride and itaconic acid are preferred. They may be used alone or in combination of two or more.

Examples of the another radically polymerizable olefinic unsaturated monomer include styrene and α-alkyl, o-alkyl, m-alkyl, p-alkyl, alkoxyl, halogen, haloalkyl, nitro, cyano, amide and ester substituted products thereof; olefins such as butadiene, isoprene and chloroprene; (meth) acrylates such as methyl (meth)acrylate, ethyl (meth)acrylate, n-propyl (meth)acrylate, i-propyl (meth)acrylate, n-butyl (meth) acrylate, sec-butyl (meth)acrylate, tert-butyl (meth)acrylate, pentyl (meth)acrylate, neopentyl (meth)acrylate, isoamyl-hexyl (meth)acrylate, cyclohexyl (meth)acrylate, adamantyl (meth)acrylate, allyl (meth)acrylate, propargyl (meth) acrylate, phenyl (meth)acrylate, naphthyl (meth)acrylate, anthracenyl (meth)acrylate, anthraquinonyl (meth)acrylate, piperonyl (meth)acrylate, salicyl (meth)acrylate, cyclohexyl (meth)acrylate, benzyl (meth)acrylate, phenethyl (meth) acrylate, cresyl (meth)acrylate, glycidyl (meth)acrylate, 1,1, 1-trifluoroethyl (meth)acrylate, perfluoroethyl (meth) acrylate, perfluoro-n-propyl (meth)acrylate, perfluoro-i-propyl (meth)acrylate, triphenylmethyl (meth)acrylate, tricyclo[5.2.1.0$^{2,6}$]decane-8-yl (meth)acrylate (commonly called "dicyclopentanyl (meth)acrylate" in this technical field), cumyl (meth)acrylate, 3-(N,N-dimethylamino)propyl (meth)acrylate, 3-(N,N-dimethylamino)ethyl (meth) acrylate, furyl (meth)acrylate and furfuryl (meth)acrylate; (meth)acrylanilide, (meth)acrylamide, N,N-dimethylamide (meth)acrylate, N,N-diethylamide (meth)acrylate, N,N-dipropylamide (meth)acrylate, N,N-diisopropylamide (meth)acrylate, anthranylamide (meth)acrylate, (meth) acrylonitrile, acrolein, vinyl chloride, vinylidene chloride, vinyl fluoride, vinylidene fluoride, N-vinylpyrrolidone, vinylpyridine, vinyl acetate, N-phenylmaleimide, N-(4-hydroxyphenyl)maleimide, N-methacryloylphthalimide and N-acryloylphthalimide.

Out of these, styrene, butadiene, phenyl (meth)acrylate, glycidyl (meth)acrylate and dicyclopentanyl (meth)acrylate are preferred as the another olefinic unsaturated monomer. They may be used alone or in combination of two or more.

The amount of the another olefinic unsaturated monomer differs according to the type of a group which provides alkali solubility. The amount of the unsaturated monomer containing a phenolic hydroxyl group is preferably 0 to 30 wt %, more preferably 5 to 20 wt % based on the total weight of the unsaturated monomer containing a phenolic hydroxyl group and the another olefinic unsaturated monomer. In the case of an unsaturated carboxylic acid and unsaturated carboxylic anhydride, the amount of the another olefinic unsaturated monomer is preferably 0 to 90 wt %, more preferably 10 to 80 wt % based on the total weight of the unsaturated carboxylic acid, unsaturated carboxylic anhydride and another olefinic unsaturated monomer. When the ratio of the another olefinic unsaturated monomer to the unsaturated monomer having an acid group such as a hydroxyl group or carboxyl group is larger than the above range, alkali developability may become unsatisfactory.

Examples of the solvent used to synthesize a polymer of the unsaturated monomer having an acid group include alcohols such as methanol, ethanol and diacetone alcohol; ethers such as tetrahydrofuran, tetrahydropyran and dioxane; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate. The amount of the solvent is preferably 20 to 1,000 parts by weight based on 100 parts by weight of the total of the reaction raw materials.

Any generally known radical polymerization initiator may be used as the polymerization initiator used for the production of the polymer of an unsaturated monomer having an acid group. Examples of the polymerization initiator include azo compounds such as 2,2'-azobisisobutyronitrile, 2,2'-azobis-(2,4-dimethylvaleronitrile) and 2,2'-azobis-(4-methoxy-2,4-dimethylvaleronitrile); organic peroxides such as benzoyl peroxide, lauroyl peroxide, t-butyl peroxypyvarate and 1,1'-bis-(t-butylperoxy)cyclohexane; and hydrogen peroxide. When a peroxide is used as the radical polymerization initiator, it may be used in conjunction with a reducing agent as a redox type initiator.

As another method of synthesizing the polymer of an unsaturated monomer having an acid group used in the present invention, a homopolymer of a monomer corresponding to a monomer having a phenolic hydroxyl group or carboxyl group of above unsaturated monomer having acid group protected by a protective group such as an alkyl group, acetyl group or phenacyl group, or a copolymer of the above monomer and another olefinic unsaturated monomer is obtained and then alkali solubility is provided by removing the protective group by a reaction such as hydrolysis.

The polymer of an unsaturated monomer having an acid group used in the present invention may be a polymer having transparency or softening point improved by hydrogenation or the like.

The weight average molecular weight in terms of polystyrene of the polymer of an unsaturated monomer having an acid group used in the present invention is preferably 2,000 to 100,000, more preferably 3,000 to 50,000, particularly preferably 5,000 to 30,000. Within the above range, there can be provided a radiation sensitive resin composition having good balance among pattern shape, resolution, developability and heat resistance, and good balance between developability and sensitivity.

Commercially available products of the polymer include hydroxystyrene (co)polymers and partial hydrides thereof such as Marukalyncur M and PHM-C (of Maruzen Petrochemical Co., Ltd.) and VP-1500 (of Nippon Soda Co., Ltd.).

1,2-Quinonediazide Compound

The 1,2-quinonediazide compound (b) used in the present invention is preferably a 1,2-quinonediazide compound having a structure that it forms a carboxylic acid by absorbing radiation. The compound is, for example, a 1,2-benzoquinonediazidesulfonic acid ester, 1,2-naphthoquinonediazidesulfonic acid ester, 1,2-benzoquinonediazidesulfonamide or 1,2-naphthoquinonediazidesulfonamide.

Specific examples of the compound include 1,2-naphthoquinonediazidesulfonic acid esters of trihydroxybenzophenone such as 2,3,4-trihydroxybenzophenone-1,2-naphthoquinonediazide-4-sulfonate, 2,3,4-trihydroxybenzophenone-1,2-naphthoquinonediazide-5-sulfonate, 2,4,6-trihydroxybenzophenone-1,2-naphthoquinonediazide-4-sulfonate and 2,4,6-trihydroxybenzophenone-1,2-naphthoquinonediazide-5-sulfonate; 1,2-naphthoquinonediazidesulfonic acid esters of tetrahydroxybenzophenone such as 2,2',4,4'-tetrahydroxybenzophenone-1,2-naphthoquinonediazide-4-sulfonate, 2,2',4,4'-tetrahydroxybenzophenone-1,2-naphthoquinonediazide-5-sulfonate, 2,3,4,3'-tetrahydroxybenzophenone-1,2-naphthoquinonediazide-4-sulfonate, 2,3,4,3'-tetrahydroxybenzophenone-1,2-naphthoquinonediazide-5-sulfonate, 2,3,4,4'-tetrahydroxybenzophenone-1,2-naphthoquinonediazide-4-sulfonate, 2,3,4,4'-tetrahydroxybenzophenone-1,2-naphthoquinonediazide-5-sulfonate, 2,3,4,2'-tetrahydroxy-4'-methylbenzophenone-1,2-naphthoquinonediazide-4-sulfonate, 2,3,4,2'-tetrahydroxy-4'-methylbenzophenone-1,2-naphthoquinonediazide-5-sulfonate, 2,3,4,4'-tetrahydroxy-3'-methoxybenzophenone-1,2-naphthoquinonediazide-4-sulfonate and 2,3,4,4'-tetrahydroxy-3'-methoxybenzophenone-1,2-naphthoquinonediazide-5-sulfonate; 1,2-naphthoquinonediazidesulfonic acid esters of pentahydroxybenzophenone such as 2,3,4,2',6'-pentahydroxybenzophenone-1,2-naphthoquinonediazide-4-sulfonate and 2,3,4,2',6'-pentahydroxybenzophenone-1,2-naphthoquinonediazide-5-sulfonate; 1,2-naphthoquinonediazidesulfonic acid esters of hexahydroxybenzophenone such as 2,4,6,3',4',5'-hexahydroxybenzophenone-1,2-naphthoquinonediazide-4-sulfonate, 2,4,6,3',4',5'-hexahydroxybenzophenone-1,2-naphthoquinonediazide-5-sulfonate, 3,4,5,3',4,',5'-hexahydroxybenzophenone-1,2-naphthoquinonediazide-4-sulfonate and 3,4,5,3',4,',5'-hexahydroxybenzophenone-1,2-naphthoquinonediazide-5-sulfonate; and 1,2-naphthoquinonediazidesulfonic acid esters of (polyhydroxyphenyl)alkane such as bis(2,4-dihydroxyphenyl)methane-1,2-naphthoquinonediazide-4-sulfonate, bis(2,4-dihydroxyphenyl)methane-1,2-naphthoquinonediazide-5-sulfonate, bis(p-hydroxyphenyl)methane-1,2-naphthoquinonediazide-4-sulfonate, bis(p-hydroxyphenyl)methane-1,2-naphthoquinonediazide-5-sulfonate, tri(p-hydroxyphenyl)methane-1,2-naphthoquinonediazide-4-sulfonate, tri(p-hydroxyphenyl)methane-1,2-naphthoquinonediazide-5-sulfonate, 1,1,1-tri(p-hydroxyphenyl)ethane-1,2-naphthoquinonediazide-4-sulfonate, 1,1,1-tri(p-hydroxyphenyl)ethane-1,2-naphthoquinonediazide-5-sulfonate, bis(2,3,4-trihydroxyphenyl)methane-1,2-naphthoquinonediazide-4-sulfonate, bis(2,3,4-trihydroxyphenyl)methane-1,2-naphthoquinonediazide-5-sulfonate, 2,2-bis(2,3,4-trihydroxyphenyl)propane-1,2-naphthoquinonediazide-4-sulfonate, 2,2-bis(2,3,4-trihydroxyphenyl)propane-1,2-naphthoquinonediazide-5-sulfonate, 1,1,3-tris(2,5-dimethyl-4-hydroxyphenyl)-3-phenylpropane -1,2-naphthoquinonediazide-4-sulfonate, 1,1,3-tris(2,5-dimethyl-4-hydroxyphenyl)-3-phenylpropane -1,2-naphthoquinonediazide-5-sulfonate, 4,4'-[1-[4-[1-[4-hydroxyphenyl]-1-methylethyl]phenyl]ethylidene] bisphenol -1,2-naphthoquinonediazide-4-sulfonate, 4,4'-[1-[4-[1-[4-hydroxyphenyl]-1-methylethyl]phenyl]ethylidene] bisphenol -1,2-naphthoquinonediazide-5-sulfonate, bis(2,5-dimethyl-4-hydroxyphenyl)-2-hydroxyphenylmethane -1,2-naphthoquinonediazide-4-sulfonate, bis(2,5-dimethyl-4-hydroxyphenyl)-2-hydroxyphenylmethane -1,2-naphthoquinonediazide-5-sulfonate, 3,3,3',3'-tetramethyl-1,1'-spirobiindene-5,6,7,5',6',7'-hexanol-1,2-naphthoquinonediazide-4-sulfonate, 3,3,3',3'-tetramethyl-1,1'-spirobiindene-5,6,7,5',6',7'-hexanol-1,2-naphthoquinonediazide-5-sulfonate, 2,2,4-trimethyl-7,2',4'-trihydroxyflavan-1,2-naphthoquinonediazide-4-sulfonate and 2,2,4-trimethyl-7,2',4'-trihydroxyflavan-1,2-naphthoquinonediazide-5-sulfonate.

Besides the above compounds, 1,2-quinonediazide compounds disclosed in "Light-Sensitive Systems", pp. 339 to 352, 1965 written by J. Kosar and published by John Wiley & Sons, New York, and "Photoresist", pp. 50, 1975 written by W. S. De Fores and published by McGraw-Hill, Inc., New York, may also be used.

The above compound may be used in the form of a condensate obtained by reacting part or all thereof with the above alkali-soluble resin (a).

Out of these 1,2-quinonediazide compounds, preferred are 1,2-naphthoquinonediazidesulfonic acid esters of trihydroxybenzophenone such as 2,3,4-trihydroxybenzophenone-1,2-naphthoquinonediazide-5-sulfonate and 2,4,6-trihydroxybenzophenone-1,2-naphthoquinonediazide-5-sulfonate; 1,2-naphthoquinonediazidesulfonic acid esters of tetrahydroxybenzophenone such as 2,3,4,3'-tetrahydroxybenzophenone-1,2-naphthoquinonediazide-5-sulfonate, 2,3,4,4'-tetrahydroxybenzophenone-1,2-naphthoquinonediazide-4-sulfonate, 2,3,4,4'-tetrahydroxybenzophenone-1,2-naphthoquinonediazide-5-sulfonate and 2,3,4,4'-tetrahydroxy-3'-methoxybenzophenone-1,2-naphthoquinonediazide-5-sulfonate; and bis(2,4-dihydroxyphenyl)methane-1,2-naphthoquinonediazide-5-sulfonate, bis(p-hydroxyphenyl)methane-1,2-naphthoquinonediazide-5-sulfonate, tri(p-hydroxyphenyl)methane-1,2-naphthoquinonediazide-5-sulfonate, 1,1,1-tri(p-hydroxyphenyl)ethane-1,2-naphthoquinonediazide-5-sulfonate, bis(2,3,4-trihydroxyphenyl)methane-1,2-naphthoquinonediazide-5-sulfonate, 2,2-bis(2,3,4-trihydroxyphenyl)propane-1,2-naphthoquinonediazide-5-sulfonate and 1,1,3-tris(2,5-dimethyl-4-hydroxyphenyl)-3-phenylpropane -1,2-naphthoquinonediazide-5-sulfonate.

More preferred are 2,3,4-trihydroxybenzophenone-1,2-naphthoquinonediazide-5-sulfonate, 1,2-naphthoquinonediazidesulfonic acid esters of tetrahydroxybenzophenone such as 2,3,4,4'-tetrahydroxybenzophenone-1,2-naphthoquinonediazide-4-sulfonate, 2,3,4,4'-tetrahydroxybenzophenone-1,2-naphthoquinonediazide-5-sulfonate and 2,3,4,4'-tetrahydroxy-3'-methoxybenzophenone-1,2-naphthoquinonediazide-5-sulfonate, 1,1,1-tri(p-hydroxyphenyl)ethane-1,2-naphthoquinonediazide-5-sulfonate, bis(2,3,4-trihydroxyphenyl)methane-1,2-naphthoquinonediazide-5-sulfonate, 2,2-bis(2,3,4-trihydroxyphenyl)propane-1,2-naphthoquinonediazide-5-sulfonate and 1,1,3-tris(2,5-dimethyl-4-hydroxyphenyl)-3-phenylpropane-1,2-naphthoquinonediazide-5-sulfonate.

The above 1,2-quinonediazide compounds maybe used alone or in admixture of two or more.

The amount of the 1,2-quinonediazide compound (b) is preferably 5 to 100 parts by weight, more preferably 10 to 50 parts by weight based on 100 parts by weight of the alkali-soluble resin (a). When the amount is smaller than 5 parts by weight, patterning may be difficult and when the amount is larger than 100 parts by weight, development with an alkaline aqueous solution developer may be difficult.

An insulating film made from a radiation sensitive resin composition containing the above alkali-soluble resin (a) and the above 1,2-quinonediazide compound (b) has no residue after development and low water permeability for use in an organic EL element and can suppress the formation of a dark area caused by a trace amount of water.

(c) Basic Nitrogen-Containing Compound

The radiation sensitive resin composition of the present invention may contain a basic nitrogen-containing compound (c). The reactivity of an insulating film made from the composition containing the basic nitrogen-containing compound (c) with a hole transport layer, organic EL layer and electron transport layer comprising a basic material and a cathode essentially composed of a metal having a low work function is fully suppressed, thereby making it possible to control the formation of a dark spot caused by the corrosion of the above layers.

The basic nitrogen-containing compound (c) used in the present invention is preferably a nitrogen-containing organic compound whose basicity is not changed by exposure or baking, as exemplified by:

(1) a Compound Represented by the Following General Formula (1) (to be referred to as "nitrogen-containing compound (I)" hereinafter):

$$R^1R^2R^3N \quad (1)$$

wherein $R^1$, $R^2$ and $R^3$ are each independently a hydrogen atom, alkyl group, aryl group or aralkyl group, with the proviso that $R^1$, $R^2$ and $R^3$ cannot be a hydrogen atom at the same time, (2) a diamino compound having two nitrogen atoms of an amino group in the same molecule (to be referred to as "nitrogen-containing compound (II) " hereinafter), (3) a polymer having three or more nitrogen atoms (to be referred to as "nitrogen-containing compound (III)" hereinafter), (4) an amide group-containing compound, (5) an urea compound, and (6) a nitrogen-containing heterocyclic compound.

These basic nitrogen-containing compounds may be used alone or in combination of two or more.

Illustrative examples of (1) the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; and aromatic amines such as aniline, N-methylaniline, N,N-dimethylaniline, 2-methylaniline, 3-methylaniline, 4-methylaniline, 4-nitroaniline, diphenylamine, triphenylamine and naphthylamine.

Out of these, trialkylamines are preferred.

Illustrative examples of (2) the nitrogen-containing compound (II) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene and 1,3-bis[1-(4-aminophenyl)-1-methylethyl]benzene.

Illustrative examples of (3) the nitrogen-containing compound (III) include poly(4-pyridine), poly(2-pyridine), poly(N-2-pyrrolidone), polyethyleneimine, polyarylamine and poly(dimethylaminoethylacrylamide).

Illustrative examples of (4) the amide group-containing compound include formamide, N-methylformamide, N,N-dimethylformamide, acetamide, N-methylacetamide, N,N-dimethylacetamide, propionamide, benzamide, pyrrolidone and N-methylpyrrolidone.

Illustrative examples of (5) the urea compound include urea, methylurea, 1,1-dimethylurea, 1,3-dimethylurea, 1,1,3,3-tetramethylurea, 1,3-diphenylurea and tributylurea.

Illustrative examples of (6) the nitrogen-containing heterocyclic compound include imidazoles such as imidazole, benzimidazole, 4-methylimidazole and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline and acridine; pyrazine, pyrazole, pyridazine, quinoxaline, purine, pyrrolidine, piperidine, morpholine, 4-methylmorpholine, piperazine, 1,4-dimethylpiperazine and 1,4-diazabicyclo[2.2.2]octane. Out of these, pyridines are particularly preferred.

Out of these basic nitrogen-containing compounds, (1) the nitrogen-containing compounds (I) and (6) the nitrogen-containing heterocyclic compounds are preferred.

In the present invention, the basic nitrogen-containing compounds (c) may be used alone or in combination of two or more.

The amount of the basic nitrogen-containing compound in the present invention is preferably 0.01 to 20 parts by weight, more preferably 0.05 to 10 parts by weight based on 100 parts by weight of the alkali-soluble resin (a). When the amount of the basic nitrogen-containing compound is smaller than 0.01 part by weight, the effect of improving the service life of the organic EL element may not be obtained to the full and when the amount is larger than 20 parts by weight, the sensitivity of the obtained radiation sensitive resin composition and the developability of the exposed portion may deteriorate.

(d) At Least One Compound Selected from Melamine Compound and Epoxy Compound

The radiation sensitive resin composition of the present invention may further contain (d) at least one compound selected from a melamine compound and an epoxy compound. When the radiation sensitive resin composition contains the compound (d), an insulating film formed from the composition achieves sufficiently high resistance to a resist stripper used to form a cathode for a passive type liquid crystal display element. Therefore, even when the insulating film is exposed to the resist stripper, it is not removed.

The melamine used in the present invention is represented by the following formula (2):

(2)

wherein $R^4$ to $R^9$ may be the same or different and each a hydrogen atom or —$CH_2OR$ group, R is a hydrogen atom or alkyl group having 1 to 6 carbon atoms, with the proviso that at least one of $R^4$ to $R^9$ must be a —$CH_2OR$ group.

Examples of the melamine represented by the above formula (2) include hexamethylol melamine, hexabutyrol melamine, partial methylol melamine and alkylated products thereof, tetramethylol benzoguanamine, partial methylol benzoguanamine and alkylated products thereof.

Out of the above melamines, commercially available products such as Cymel 300, 301, 303, 370, 325, 327, 701, 266, 267, 238, 1141, 272, 202, 1156, 1158, 1123, 1170, 1174, UFR65 and 300 (of Mitsui Cyanamid Co., Ltd.) and Nikalac Mx-750, -032, -706, -708, -40 and 31, Nikalac Ms-11 and Nikalac Mw-30 (of Sanwa Chemical Co., Ltd.) are preferred.

The amount of the melamine is preferably 1 to 100 parts by weight, more preferably 5 to 50 parts by weight based on 100 parts by weight of the alkali-soluble resin (a). When the amount is smaller than 1 part by weight, the crosslinking density lowers and the obtained insulating film may be inferior in alkali resistance. When the amount is larger than 100 parts by weight, the alkali solubility of the whole composition becomes too high, thereby readily causing such a problem as a decline in the film retention rate after development.

The epoxy resin used in the present invention is preferably, for example, a phenol novolak epoxy resin, cresol novolak epoxy resin, bisphenol A epoxy resin, bisphenol F epoxy resin, alicyclic epoxy resin or aliphatic polyglycidiyl ether. The following commercially available products of the epoxy resin may be used.

Commercially available products of the phenol novolak epoxy resin include Epicoat 152 and 154 (of Yuka Shell Epoxy Co., Ltd.) and EPPN 201 and 202 (of Nippon Kayaku Co., Ltd.).

Commercially available products of the cresol novolak epoxy resin include EOCN-102, 103S, 104S, 1020, 1025 and 1027 (of Nippon Kayaku Co., Ltd.) and Epicoat 180S75 (of Yuka Shell Epoxy Co., Ltd.).

Commercially available products of the bisphenol A epoxy resin include Epicoat 1001, 1002, 1003, 1004, 1007, 1009, 1010 and 828 (of Yuka Shell Epoxy Co., Ltd.).

Commercially available products of the bisphenol F epoxy resin include Epicoat 807 (of Yuka Shell Epoxy Co., Ltd.).

Commercially available products of the alicyclic epoxy resin include CY-175, 177 and 179 (of Ciba-Geigy Co., Ltd.), ERL-4234, 4299, 4221 and 4206 (of U.U.C. Co., Ltd.), Showdyne 509 (of Showa Denko K.K.), Aldalite CY-182, 192 and 184 (of Ciba-Geigy Co., Ltd.), Epiclon 200 and 400 (of Dainippon Ink & Chemicals, Inc.), Epicoat 871 and 872 (of Yuka Shell Epoxy Co., Ltd.), and ED-5661 and 5662 (of Ceranees Coating Co., Ltd.).

Commercially available products of the aliphatic polyglycidyl ether include Epolite 100MF, 200E and 400E (of Kyoeisha Yushi Kagaku Kogyo Co., Ltd.) and Epiol TMP (of NOF Corporation).

They may be used in combination of two or more.

The amount of the epoxy resin is preferably 1 to 100 parts by weight, more preferably 5 to 50 parts by weight based on 100 parts by weight of the alkali-soluble resin (a).

Other Additives

The radiation sensitive resin composition of the present invention may contain other additives in limits not prejudicial to the object of the present invention. The other additives include, for example, a sensitizer, surfactant, adhesion aid, keeping stabilizer and defoamer.

The above sensitizer may be blended to improve the radiation sensitivity of the radiation sensitive composition of the present invention. Examples of the sensitizer include 2H-pyrido-(3,2-b)-1,4-oxazin-3(4H)-ones, 10H-pyrido-(3, 2-b)-(1,4)-benzothiazines, urazols, hydantoins, barbituric acid, glycine anhydrides, 1-hydroxybenzotriazoles, alloxans and maleimides. The amount of the sensitizer is preferably 100 parts or less by weight, more preferably 1 to 50 parts by weight based on 100 parts by weight of the 1,2-quinonediazide compound (b).

The above surfactant may be blended to improve coatability, for example, striation and the developability of an exposed portion after the formation of a dry coating film.

Examples of the surfactant include nonionic surfactants such as polyoxyethylene alkyl ethers including polyoxyethylene lauryl ether, polyoxyethylene stearyl ether and polyoxyethylene oleyl ether, polyoxyethylene aryl ethers including polyoxyethylene octylphenyl ether and polyoxyethylene nonylphenyl ether, and polyethylene glycol dialkyl esters including polyethylene glycol dilaurate and polyethylene glycol distearate; fluorine-containing surfactants such as F Top EF301, 303 and 352 (of Shin Akita Kasei Co., Ltd.), Megafac F171, 172 and 173 (of Dainippon Ink and Chemicals, Inc.), Florade FC430 and 431 (of Sumitomo 3M, Ltd.), Asahi Guard AG710 and Surflon S-382, SC-101, 102, 103, 104, 105 and 106 (of Asahi Glass Co., Ltd.); and organosiloxane polymer KP341 (of Shin-Etsu Chemical Co., Ltd.) and acrylic acid or methacrylic acid (co)polymer Polyflow No. 57 and 95 (of Kyoeisha Kagaku Co., Ltd.). The amount of the surfactant is preferably 2 parts or less by weight, more preferably 1 part or less by weight based on the solids content of the composition.

The above adhesion aid may be used to improve adhesion between an insulating film formed from the radiation sensitive composition of the present invention and a substrate. The adhesion aid is preferably a functional silane coupling agent such as a silane coupling agent having a reactive substituent such as a carboxyl group, methacryloyl group, isocyanate group or epoxy group. Specific examples of the adhesion aid include trimethoxysilylbenzoic acid, γ-methacryloxypropyl trimethoxysilane, vinyltriacetoxysilane, vinyltrimethoxysilane, γ-isocyanate propyltriethoxysilane, γ-glycidoxypropyl trimethoxysilane and γ-(3,4-epoxycyclohexyl)ethyltrimethoxysilane. The amount of the above surfactant is preferably 15 parts or less by weight, more preferably 10 parts or less by weight based on 100 parts by weight of the solids content of the composition.

The radiation sensitive resin composition of the present invention is generally dissolved in a solvent before use.

The solvent used for the preparation of the radiation sensitive resin composition of the present invention dissolves the above alkali-soluble resin (a), 1,2-quinoneazide compound (b), basic nitrogen-containing compound (c) and a melamine, epoxy resin and other additives optionally added (d) and does not react with these components.

Examples of the solvent used to prepare the radiation sensitive resin composition of the present invention include glycol ethers such as ethylene glycol monomethyl ether and ethylene glycol monoethyl ether; ethylene glycol alkylether acetates such as methyl cellosolve acetate and ethyl cellosolve acetate; diethylene glycol alkyl ethers such as diethylene glycol monomethyl ether and diethylene glycol monoethyl ether; propylene glycol alkyl ether acetates such as propylene glycol methyl ether acetate, propylene glycol ethyl ether acetate and propylene glycol propyl ether acetate; aromatic hydrocarbons such as toluene and xylene; ketones such as methyl ethyl ketone, cyclohexanone, 2-heptanone and methyl isobutyl ketone; and esters such as methyl 2-hydroxypropionate, ethyl 2-hydroxypropionate, ethyl 2-hydroxy-2-methylpropionate, ethyl 2-hydroxy-2-methylpropionate, ethyl ethoxyacetate, ethyl oxyacetate, methyl 2-hydroxy-3-methylbutanoate, 3-methyl-3-methoxybutylacetate, 3-methyl-3-methoxybutylpropionate, 3-methyl-3-methoxybutylbutyrate, ethyl acetate, butyl acetate, methyl 3-methoxypropionate, ethyl 3-methoxypropionate and butyl 3-methoxypropionate.

Out of these solvents, glycol ethers, ethylene glycol alkyl ether acetates, propylene glycol alkyl ether acetates, esters and diethylene glycols are preferred from the viewpoints of solubility, reactivity with each component and ease of forming a coating film.

These solvents may be used alone or in admixture.

Further, a high-boiling solvent maybe used as required, as exemplified by benzyl ethyl ether, dihexyl ether, diethylene glycol monomethyl ether, diethylene glycol monoethyl ether, diethylene glycol monobutyl ether, acetonyl acetone, isophorone, caproic acid, caprylicacid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate and carbitol acetate.

The radiation sensitive resin composition of the present invention is prepared by using the above solvent. Although the radiation sensitive resin composition may have a suitable solids content according to its application purpose, the solids content may be, for example, 20 to 40 wt %.

The composition solution prepared as described above is filtered with a Millipore filter having an opening diameter of about 0.2 μm, preferably about 0.1 μm, before use.

The first composition of the present invention is used to form an insulating film for an organic EL display element.

A description is subsequently given of the second composition of the present invention.

The second composition contains (a') an alkali-soluble resin having an epoxy group and (b) a 1,2-quinonediazide compound.

(a') Alkali-Soluble Resin Having an Epoxy Group

The second composition of the present invention contains (a') an alkali-soluble resin having an epoxy group, has suitable solubility in an alkaline developer and can be easily cured by heating without using a special curing agent.

The alkali-soluble resin having an epoxy group (a') used in the present invention is not particularly limited if it has an epoxy group and has alkali solubility. It may be, for example, a copolymer obtained by copolymerizing (1a') an unsaturated monomer having an epoxy group, (2a') at least one monomer selected from an unsaturated carboxylic acid, unsaturated carboxylic anhydride and unsaturated monomer having a phenolic hydroxyl group and (3a') an olefinic unsaturated compound other than (1a') and (2a').

Examples of the unsaturated monomer having an epoxy group (1a') include (meth)acrylates having an epoxy group such as glycidyl (meth)acrylate, β-methylglycidyl (meth) acrylate, β-ethylglycidyl (meth)acrylate, β-propylglycidyl (meth)acrylate, glycidyl α-ethylacrylate, β-methylglycidyl α-ethylacrylate, 3-methyl-3,4-epoxybutyl (meth)acrylate, 3-ethyl-3,4-epoxybutyl (meth)acrylate, 4-methyl-4,5-epoxypentyl (meth)acrylate and 5-methyl-5,6-epoxyhexyl (meth)acrylate; styrenederivatives having an epoxy group such as o-vinylbenzylglycidyl ether, m-vinylbenzylglycidyl ether, p-vinylbenzylglycidyl ether, α-methyl-o-vinylbenzylglycidyl ether, α-methyl-m-vinylbenzylglycidyl ether and α-methyl-p-vinylbenzylglycidyl ether; styrene derivatives having two epoxy groups such as 2,3-diglycidyloxymethylstyrene, 2,4-diglycidyloxymethylstyrene, 2,5-diglycidyloxymethylstyrene, 2,6-diglycidyloxymethylstyrene and 2,6-diglycidyloxymethylstyrene; and styrene derivatives having three epoxy groups such as 2,3,4-triglycidyloxymethylstyrene, 2,3,5-triglycidyloxymethylstyrene, 2,3,6-triglycidyloxymethylstyrene, 3,4,5-triglycidyloxymethylstyrene and 2,4,6-triglycidyloxymethylstyrene.

Out of these, glycidyl (meth)acrylate, β-methylglycidyl (meth)acrylate, o-vinylbenzylglycidyl ether, m-vinylbenzylglycidyl ether and p-vinylbenzylglycidyl ether are preferred from the viewpoints of the transparency, developability and solvent resistance of the obtained insulating film.

They may be used alone or in combination of two or more.

The amount of the unsaturated monomer having an epoxy group (1a') is preferably 20 to 90 wt %, more preferably 30 to 80 wt %, particularly preferably 40 to 70 wt %.

When the amount is smaller than 20 wt %, resistance to a remover used for the wet etching of an ITO electrode may become unsatisfactory and when the amount is larger than 90 wt %, solubility in an alkaline developer may become too low, thereby causing a problem with developability.

Preferred examples of the at least one monomer selected from an unsaturated carboxylic acid, unsaturated carboxylic anhydride and unsaturated monomer having a phenolic hydroxyl group (2a') include hydroxystyrenes such as o-hydroxystyrene, m-hydroxystyrene, p-hydroxystyrene and alkyl, alkoxy, halogen, haloalkyl, nitro, cyano, amide, ester and carboxy substituted products thereof; polyhydroxyvinyl phenols such as vinylhydroquinone, 5-vinylpyrogallol, 6-vinylpyrogallol and 1-vinylphloroglucinol; vinylbenzoic acids such as o-vinylbenzoic acid, m-vinylbenzoic acid, p-vinylbenzoic acid and alkyl, alkoxy, halogen, nitro, cyano, amide and ester substituted products thereof; (meth)acrylic acids such as methacrylic acid, acrylic acid and α-position haloalkyl, alkoxy, halogen, nitro and cyano substituted products thereof; and divalent unsaturated carboxylic acids such as maleic acid, maleic anhydride, fumaric acid, citraconic acid, mesaconic acid, itaconic acid and 1,4-cyclohexenedicarboxylic acid, and methyl, ethyl, propyl, i-propyl, n-butyl, sec-butyl, ter-butyl, phenyl, o-, m- and p-toluyl half esters and half amides thereof.

Out of these, (meth)acrylic acid, maleic anhydride and fumaric acid are particularly preferred from the viewpoint of developability.

They may be used alone or in combination of two or more.

The amount of the monomer (2a') is preferably 3 to 45 wt %, more preferably 6 to 30 wt %, much more preferably 10 to 25 wt %.

When the amount is smaller than 3 wt %, developability in an alkali developer may become too low and when the amount is larger than 45 wt %, not only the exposed portion but also the unexposed portion of the obtained radiation sensitive resin composition may have solubility in an alkali developer, thereby making it impossible to form a pattern.

Examples of the olefinic unsaturated compound (3a') other than (1a') and (2a') include alkyl methacrylates such as methyl methacrylate, ethyl methacrylate, n-butyl methacrylate, sec-butyl methacrylate and t-butyl methacrylate; alkyl acrylates such as methyl acrylate and isopropyl acrylate; cyclic alkyl methacrylates such as cyclohexyl methacrylate, 2-methylcyclohexyl methacrylate, tricyclo

[5.2.1.0$^{2,6}$ ]decane-8-yl methacrylate (commonly called "dicyclopentanyl methacrylate" in this technical field), dicyclopentanyloxyethyl methacrylate and isobornyl methacrylate; cyclic alkyl acrylates such as cyclohexyl acrylate, 2-methylcyclohexyl acrylate, tricyclo[5.2.1.0$^{2,6}$ ]decane-8-yl acrylate (commonly called "dicyclopentanyl acrylate" in this technical field), dicyclopentanyloxyethyl acrylate and isobornyl acrylate; aryl methacrylates such as phenyl methacrylate and benzyl methacrylate; aryl acrylates such as phenyl acrylate and benzyl acrylate; dicarboxylic acid diesters such as diethyl maleate, diethyl fumarate and diethyl itaconate; hydroxyalkyl esters such as 2-hydroxyethyl methacrylate and 2-hydroxypropyl methacrylate; styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene, 2,3-dimethyl-1,3-butadiene, phenyl maleimide, ethylene glycol diacrylate, diethylene glycol diacrylate, triethylene glycol diacrylate, neopentyl glycol diacrylate, glycerol diacrylate, ethylene glycol dimethacrylate, diethylene glycol dimethacrylate, triethylene glycol dimethacrylate, neopentyl glycol dimethacrylate and glycerol dimethacrylate.

Out of these, styrene, butadiene, n-propyl acrylate, tricyclo[5.2.1.0$^{2,6}$ ]decane-8-yl acrylate, methyl methacrylate, 2-hydroxyethyl methacrylate and n-butyl methacrylate are preferred from the viewpoints of developability and the transparency of the obtained insulating film.

They may be used alone or in combination.

The amount of the monomer (3a') is preferably 2 to 80 wt %, more preferably 5 to 60 wt %, much more preferably 10 to 40 wt %.

The solvent and polymerization initiator used to copolymerize the above components (1a'), (2a') and (3a') may be the same as those listed for the polymer of an unsaturated monomer having an acid group used in the first composition.

To copolymerize the above components (1a'), (2a') and (3a'), a molecular weight modifier for adjusting the molecular weight may be used. Examples of the molecular weight modifier include hydrocarbon halides such as chloroform and carbon tetrabromide; mercaptans such as n-hexylmercaptan, n-octylmercaptan, n-dodecylmercaptan, tert-dodecylmercaptan and thioglycolic acid; xanthogens such as dimethylxanthogen sulfide and diisopropylxanthogen disulfide; terpinolene and α-methylstyrene dimer.

The weight average molecular weight in terms of polystyrene (Mw) of the alkali-soluble resin having an epoxy group (a') is preferably 2,000 to 100,000, more preferably 3,000 to 50,000, particularly preferably 5,000 to 30,000. Within the above range, there can be provided a radiation sensitive resin composition having good balance among pattern shape, resolution, developability and heat resistance and good balance between developability and sensitivity.

When the weight average molecular weight is higher than 100,000, it may be difficult to apply the composition to a wafer uniformly, and developability and sensitivity may deteriorate. When the weight average molecular weight is lower than 2,000, not only the exposed portion but also the unexposed portion may exhibit solubility in an alkali developer, thereby making it impossible to form a pattern.

The component (a') may be synthesized by introducing a protective group into the carboxyl group or phenolic hydroxyl group of the above monomer (2a') before copolymerization and removing the protective group after copolymerization to provide alkali solubility.

The insulting film obtained from the composition of the present invention has sufficiently high transparency but the visible light transparency of the film can be further improved by hydrogenating the component (a') synthesized as described above. The softening point can also be changed by this treatment.

Examples of the 1,2-quinonediazide compound used in the second composition are the same as those listed for the 1,2-quinonediazide compound used in the first composition.

The above 1,2-quinonediazide compounds may be used alone or in combination of two or more.

The amount of the 1,2-quinonediazide compound (b) is preferably 5 to 100 parts by weight, more preferably 10 to 50 parts by weight based on 100 parts by weight of the alkali-soluble resin having an epoxy group (a'). When the amount is smaller than 5 parts by weight, patterning may be difficult and when the amount is larger than 100 parts by weight, development with an aqueous alkaline solution developer may be difficult.

The second composition of the present invention may contain other additives in limits not prejudicial to the object of the present invention. The additives include a sensitizer, surfactant, adhesion aid, keeping stabilizer and defoamer.

Examples of these additives are the same as those listed for the first composition.

The second composition is dissolved in the same solvent as that for the first composition. The second composition may have a suitable solids content according to its application purpose and the solids content may be, for example, 20 to 40 wt %.

The composition solution prepared as described above is filtered with a Millipore filter having an opening diameter of about 0.2 μm, preferably about 0.1 μm, before use.

Method of Forming an Insulating Film for an Organic EL Display Element

An insulating film for an organic EL display element can be formed from the radiation sensitive resin composition of the present invention as follows, for example.

The radiation sensitive resin composition of the present invention is applied to the surface of a base substrate and prebaked to remove the solvent in order to form a coating film. The application method can be suitably selected from spraying, roll coating, rotary coating and bar coating.

As for prebaking conditions which differ according to the type and amount of each component, the coating film is the most preferably prebaked at 60 to 110° C. for 0.5 to 15 minutes.

The thickness of the film after prebaking can be adjusted to a desired value according to the solids content and application conditions of the radiation sensitive composition, for example, 0.25 to 4 μm.

Thereafter, the formed coating film is exposed to radiation through a predetermined pattern mask. The radiation used for exposure is ultraviolet ray such as g-line having a wavelength of 436 nm and i-line having a wavelength of 365 nm, deep ultraviolet ray such as KrF excimer laser beams, X-ray such as synchrotron radiation or charged corpuscular beams such as electron beams. Out of these, g-line and i-line are preferred.

After exposure to radiation, a desired pattern can be obtained by developing with a developer to remove an exposed portion. The developer is preferably an alkali aqueous solution prepared by dissolving in water an inorganic alkali such as sodium hydroxide, potassium hydroxide, sodium carbonate, sodium silicate, sodium metasilicate or ammonia water; primary amine such as ethylamine or n-propylamine; secondary amine such as diethylamine or di-n-propylamine; tertiary amine such as triethylamine or methyldiethylamine; alcohol amine such as dimethylethanolamine or triethanolamine; quaternary ammonium salt such as tetramethylammoniumhydroxide, tetraethylammoniumhydroxide or choline; or cyclic amine such as pyrrole, piperidine, 1,8-diazabicyclo-(5.4.0)-7-undecene or 1,5-diazabicyclo-(4.3.0)-5-nonane. The developer may contain a water-soluble organic solvent such as an alcohol exemplified by methanol and ethanol, or a surfactant in a suitable amount. Further, an organic solvent which dissolves the composition of the present invention may be used as the developer.

The development method is, for example, puddle development, dipping or shaking immersion.

After development, the patterned film may be rinsed with running water.

The entire surface of the film may be further exposed to radiation from a high-pressure mercury lamp to decompose the residual 1,2-quinonediazide compound contained in the film.

Thereafter, this film is heated with a heater such as a hot plate or oven to be cured. The heating temperature for curing is, for example, 150 to 250° C. and the heating time is 5 to 30 minutes when the film is baked on a hot plate and 30 to 90 minutes when it is baked in an oven.

Production of Organic EL Element

The organic EL element of the present invention comprises the insulating film formed as described above.

The organic EL element of the present invention is produced from the first composition as follows, for example.

A transparent electrode such as an ITO electrode is formed on a glass substrate by sputtering and a positive type photoresist pattern is formed the electrode. Thereafter, the ITO film is etched with a hydrochloric acid-based etchant and the resist film is removed to form a transparent electrode pattern such as a striped pattern. An insulating film pattern is formed from the first composition of the present invention on the substrate having this transparent electrode pattern as described above. Thereafter, an electron transport layer, inversely tapered cathode partitions, electron hole transport layer, organic EL emitting layer and cathode layer are formed on this insulating film pattern sequentially.

An organic EL element is produced from the second composition as follows, for example.

A drive terminal is formed on a substrate such as a glass substrate and an insulating film is formed from the second composition of the present invention on the terminal as described above. A transparent electrode such as an ITO electrode (hole injection electrode) is formed on the insulating film by sputtering and a pattern is formed by wet etching.

An electron hole transport layer, organic EL layer, electron transport layer and electron injection electrode are formed on the electrode by deposition sequentially.

In the above both cases, the electron hole transport layer is made from a phthalocyanine-based material such as CuPc or $H_2Pc$, or an aromatic amine. A low molecular organic EL material produced by doping a substrate made from $Alq_3$ or $BeBq_3$ with quinacridone or coumarin, or a high molecular organic EL material such as a polyphenylene-based or fluorene-based material is used as an organic EL emissive material. Further, Mg—Al, Al—Li, Al—$Li_2O$ or Al—LiF is used as a cathode material.

Thereafter, a hollow stainless steel can and the above substrate are sealed with a sealer such as an epoxy resin and assembled together into a module as an organic EL element.

Since the organic EL emitting layer is generally formed by deposition when a low molecular organic EL material is used as the above organic EL emissive material, the first composition of the present invention may be preferably used as a composition for forming an insulating film for use in this organic EL display element.

Since the organic EL emitting layer is generally formed by dissolving an organic EL emissive material in a solvent and applying the solution when a high molecular organic EL material is used as the above organic EL emissive material, the first composition which contains (d) at least one compound selected from a melamine compound and an epoxy compound or a combination of (c) a nitrogen-containing basic compound and (d) at least one compound selected from a melamine compound and an epoxy compound is preferably used as a composition for forming an insulating film for use in this organic EL display element.

EXAMPLES

The following examples are provided for the purpose of further illustrating the present invention but are in no way to be taken as limiting. The molecular weight measured hereinafter is a weight average molecular weight in terms of polystyrene measured by the GPC chromatograph HLC-8020 of Toso Corporation.

Synthesis Example 1 of Alkali-Soluble Resin
(Novolak Resin)

After 57 g (0.6 mol) of metacresol, 38 g (0.4 mol) of paracresol, 75.5 g of a 37 wt % aqueous solution of formaldehyde (corresponding to 0.93 mol of formaldehyde), 0.95 g (0.005 mol) of p-toluenesulfonic acid monohydrate and 264 g of methylisobutyl ketone were fed to a 1-liter stainless steel (SUS316L) flask equipped with a cooling tube, stirrer and thermometer, the flask was immersed in an oil bath to carry out polycondensation under agitation at 130° C. for 4 hours while the reaction solution was refluxed.

The temperature of the oil bath was then elevated to 180° C. over 3 hours, the inside pressure of the flask was reduced to 30 mmHg to remove volatile matter, and the molten resin was collected by cooling to room temperature. After this resin was dissolved in ethyl acetate to a resin content of 30%, methanol and water were added to this solution in amounts 1.3 times and 0.9 time the weight of the solution, respectively, stirred and left.

The solution was separated into two layers and the lower layer was taken out, concentrated and dried to collect a resin 1. This resin 1 had a weight average molecular weight (Mw) of 8,000.

Synthesis Example 2 of Alkali-Soluble Resin
(Novolak Resin)

After 76 g (0.8 mol) of metacresol, 13.9 g (0.12 mol) of 2,3-xylenol, 9.3 g (0.08 mol) of 3,4-xylenol, 78 g of a 37 wt % aqueous solution of formaldehyde (corresponding to 0.96 mol of formaldehyde), 0.95 g (0.005 mol) of p-toluenesulfonicacidmonohydrate and 264 g of methylisobutyl ketone were fed to a 1-liter stainless steel (SUS316L) flask equipped with a cooling tube, stirrer and thermometer, the flask was immersed in an oil bath to carry out polycondensation under agitation for 4 hours while the reaction solution was refluxed.

The temperature of the oil bath was then elevated to 180° C. over 3 hours, the inside pressure of the flask was reduced to 30 mmHg to remove volatile matter, and the molten resin was collected by cooling to room temperature. After this resin was dissolved in ethyl acetate to a resin content of 30%, methanol and water were added to this solution in amounts 1.3 times and 0.9 time the weight of the solution, respectively, stirred and left.

The solution was separated into two layers and the lower layer was taken out, concentrated and dried to collect a resin 2. This resin 2 had a weight average molecular weight (Mw) of 7,500.

Synthesis Example 3 of Alkali-Soluble Resin
(Novolak Resin)

After 54.07 g (0.50 mol) of metacresol, 54.07 g (0.50 mol) of paracresol, 71 g of a 37 wt % aqueous solution of formaldehyde (corresponding to 0.88 mol of formaldehyde) and 6.3 g (0.05 mol) of oxalic acid dihydrate were fed to a 1-liter flask equipped with a stirrer and thermometer, the flask was immersed in an oil bath to carry out a polycondensation reaction for 120 minutes under agitation while the inside temperature of the flask was maintained at 100° C. After the temperature of the oil bath was elevated to 180° C. and the inside pressure of the flask was reduced to 30 mmHg to remove volatile matter, the molten resin 3 was collected by cooling to room temperature. The resin 3 had a weight average molecular weight (Mw) of 8,800.

Synthesis Example 4 of Alkali-Soluble Resin

After 95.0 g of p-tert-butoxystyrene, 5.0 g of styrene, 10.0 g of 2,2'-azobisisobutyronitrile and 100.0 g of dioxane were fed to a separable flask equipped with a stirrer, cooling tube, nitrogen introduction tube and thermometer and purged with nitrogen for 30 minutes, the flask was immersed in an oil bath to carry out polymerization for 5 hours under agitation while the inside temperature of the flask was maintained at 80° C. 60 g of a 7.2% aqueous solution of hydrochloric acid was added to the obtained resin solution, heated at 80° C. and stirred for 3 hours to hydrolyze a tert-butoxy group so as to convert it into a hydroxyl group. The reaction mixture was dissolved in acetone and the resulting solution was added to 10 liters of a mixed solution of methanol and water (volume ratio of water to methanol=8/2) in order to obtain a precipitate (this operation will be referred to as "re-precipitation" hereinafter). This re-precipitation was carried out twice to obtain a precipitate containing no impurities. This precipitate was vacuum dried at 50° C. for one night to obtain white resin powders (this resin will be referred to as "resin 4" hereinafter). The yield of the resin 4 was 95%. The weight average molecular weight of the resin 4 was $1.01 \times 10^4$.

Synthesis Example 5 of Alkali-Soluble Resin

An alkali-soluble resin (to be referred to as "resin 5" hereinafter) was synthesized in the same manner as in Synthesis Example 4 except that 100.0 g of p-tert-butoxystyrene, 10.0 g of 2,2'-azobisisobutyronitrile and 100.0 g of dioxane were fed to a similar separable flask to that of Synthesis Example 4.

The yield of the obtained resin 5 was 95% and the weight average molecular weight of the resin 5 was $2.21 \times 10^4$.

Synthesis Example 6 of Alkali-Soluble Resin

An alkali-soluble resin (to be referred to as "resin 6" hereinafter) was synthesized in the same manner as in Synthesis Example 4 except that 95.0 g of p-tert-butoxystyrene, 5.0 g of phenyl methacrylate, 10.0 g of 2,2'-azobisisobutyronitrile and 100.0 g of dioxane were fed to a similar separable flask to that of Synthesis Example 4.

The yield of the obtained resin 6 was 94% and the weight average molecular weight of the resin 6 was $2.30 \times 10^4$.

Synthesis Example 7 of Alkali-Soluble Resin

After 7.5 g of butadiene, 20.0 g of methacrylic acid, 22.5 g of dicyclopentanyl methacrylate, 50.0 g of glycidyl methacrylate, 4.0 g of 2,2'-azobisisobutyronitrile and 250.0 g of diethylene glycol dimethyl ether were fed to a similar separable flask to that of Synthesis Example 4 and purged with nitrogen for 30 minutes, the separable flask was immersed in an oil bath to carry out polymerization under agitation for 4 hours while the inside temperature of the flask was maintained at 80° C. to obtain a solution containing a resin 7. The obtained solution of the resin 7 had a solids content of 30%. The resin 7 had a weight average molecular weight in terms of polystyrene of $2.02 \times 10^4$.

Synthesis Example 8 of Alkali-Soluble Resin

A solution containing a resin 8 was obtained in the same manner as in Synthesis Example 7 except that 7.5 g of styrene, 20.0 g of methacrylic acid, 22.5 g of dicyclopentanyl methacrylate, 50.0 g of glycidyl methacrylate, 4.0 g of 2,2'-azobisisobutyronitrile and 250.0 g of diethylene glycol dimethyl ether were fed to a similar separable flask to that of Synthesis Example 4. The obtained resin 8 had a solids content of 30%. The resin 8 had a weight average molecular weight in terms of polystyrene of $2.13 \times 10^4$.

Synthesis Example 9 of Alkali-Soluble Resin

White resin powders (this resin will be referred to as "resin 9" hereinafter) were obtained in the same manner as in Synthesis Example 4 except that 100.0 g of p-tert-butoxystyrene, 2.0 g of 2,2'-azobisisobutyronitrile and 100.0 g of dioxane were fed to a similar separable flask to that of Synthesis Example 4. The yield of the obtained resin 9 was 95% and the molecular weight thereof was $3.45 \times 10^4$.

Synthesis Example 10 of Alkali-Soluble Resin

Light yellow resin powders (this resin will be referred to as "resin 10" hereinafter) were obtained in the same manner as in Synthesis Example 4 except that 100.0 g of p-tert-butoxystyrene, 15.0 g of 2,2'-azobisisobutyronitrile and 200.0 g of dioxane were fed to a similar separable flask to that of Synthesis Example 4. The yield of the obtained resin 10 was 94% and the molecular weight thereof was $1.81 \times 10^3$.

Synthesis Example 11 of Alkali-Soluble Resin having an Epoxy Group

After 50.0 g of glycidyl methacrylate as the monomer (1a'), 20.0 g of methacrylic acid as the monomer (2a'), 7.5 g of butadiene and 22.5 g of tricyclo[$5.2.1.0^{2,6}$]decane-8-yl methacrylate as the components (3a'), 250.0 g of diethylene glycol dimethyl ether as a solvent and 4.0 g of 2,2'-azobisbutyronitrile as a polymerization initiator were fed to a 1-liter separable flask equipped with a stirrer and a thermometer and purged with nitrogen for 30 minutes, the separable flask was immersed in an oil bath to carry out polymerization under agitation for 3.5 hours while the inside temperature was maintained at 80° C. to obtain a solution containing a resin 11. The obtained solution containing the resin 11 had a solids content of 30 wt %. The weight average molecular weight in terms of polystyrene of the resin 11 was $2.1 \times 10^4$.

Synthesis Example 12 of Alkali-Soluble Resin having an Epoxy Group

A solution containing a resin 12 was obtained in the same manner as in Synthesis Example 11 except that 28.0 g of o-vinylbenzylglycidyl ether and 40.0 g of glycidyl methacrylate as the monomers (1a'), 22.0 g of methacrylic acid as the monomer (2a') and 10.0 g of styrene as the monomer (3a') were used. The solution containing the resin 12 had a solids content of 30 wt %. The weight average molecular weight in terms of polystyrene of the resin 12 was $1.7 \times 10^4$.

Synthesis Example 13 of Alkali-Soluble Resin having an Epoxy Group

A solution containing a resin 13 was obtained in the same manner as in Synthesis Example 11 except that 21.0 g of o-vinylbenzylglycidyl ether and 25.0 g of glycidyl methacrylate as the monomers (1a'), 18.0 g of methacrylic acid as the monomer (2a'), and 10.0 g of styrene and 26.0 g of n-propyl acrylate as the monomers (3a') were used. The solution containing the resin 13 had a solids content of 30 wt %. The weight average molecular weight in terms of polystyrene of the resin 13 was $1.5 \times 10^4$.

Example 1

Preparation of Radiation Sensitive Resin Composition Containing Components (a) and (b)

100 parts by weight of the resin 1 obtained in Synthesis Example 1 as the component (a) and 30 parts by weight of a condensate (1,1,3-tris(2,5-dimethyl-4-hydroxyphenyl)-3-phenylpropane-1,2-naphthoquinonediazide-5-sulfonate) of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b) were mixed together, the obtained mixture was diluted with and dissolved in methyl 3-methoxypropionate to a solids content of 30 wt %, and the resulting solution was filtered with a membrane filter having an opening diameter of 0.2 μm to prepare a composition solution.

(1) Evaluation of Radiation Sensitivity

The composition solution prepared above was applied to the surface of a glass substrate with a spin coater to a film thickness of 1.0 μm and pre-baked on a hot plate at 80° C. for 1.5 minutes. Thereafter, the formed coating film was exposed to radiation through a 30 μm line-and-space pattern mask using the NSR1755i7A reduction projection exposure tool (NA=0.50, λ=365 nm) of Nikon Corporation and developed with an aqueous solution of tetramethylammonium hydroxide at 25° C. for 1 minute The film was then washed with running water and dried to form a pattern on the wafer in order to find the minimum amount of exposure with which a 30 μm pattern could be formed. This value is shown in Table 1. When this value is 200 mJ/cm$^2$ or less, it can be said that radiation sensitivity is satisfactory.

(2) Formation of Patterned Thin Film

The composition solution prepared above was applied to the surface of a glass substrate to a film thickness of 1.0 μm with a spin coater and pre-baked on a hot plate at 80° C. for 1.5 minutes. Thereafter, the coating film was exposed to radiation through a predetermined pattern mask using the NSR1755i7A reduction projection exposure tool (NA=0.50, λ=365 nm) of Nikon Corporation. The amount of exposure at this point was set to the minimum amount with which a 30 μm pattern could be formed, measured in (1) above. Thereafter, the coating film was developed with an aqueous solution of tetramethylammonium hydroxide at 25° C. for 1 minute. The film was then washed with running water and dried to form a pattern on the wafer. Thereafter, the pattern was exposed to 300 mJ/cm$^2$ of ultraviolet radiation which was ghi mixed-rays using the Aligner PLA501F of Canon Inc. and heated in an oven at 220° C. for 60 minutes to form a patterned thin film.

(3) Evaluation of Sectional Form

The sectional form of the above patterned thin film was observed by a scanning electron microscope (S-4200 of Hitachi, Ltd.) to measure the tapered angle of the sectional form (angle formed by the bottom side and the tangent of the edge portion of the sectional form of the pattern, the same shall apply hereinafter). The result is shown in Table 1. When this value is 50° or less, it can be said that the sectional form of the pattern is satisfactory.

(4) Existence of the Residue after Development

A patterned thin film was formed on a glass substrate having an ITO film deposited thereon in the same manner as in (2) to check the existence of the residue after development by the following two methods.

(1) Visual observation using a green lamp (of Funatec Co., Ltd.)

(2) Observation at a magnification of X40,000 using a scanning electron microscope (S-4200 of Hitachi, Ltd.)

The observation results are shown in Table 1.

(5) Water Permeability

The above composition solution was applied to a 25 μm thick polyimide sheet to a film thickness of 10 μm with a spinner, pre-baked at 80° C. for 1.5 minutes and heated at 220° C. for 60 minutes to form a cured film on the polyimide sheet. An aluminum cup containing 15 g of distilled water was covered with this film to seal it up. This was placed in a thermostatic oven heated at 50° C. to measure a reduction in the weight of the cup after 150 hours in order to calculate water permeability per unit area. The result is shown in Table 1. When this value is 500 g/cm$^2$ or less, it can be said that water permeability is sufficiently low.

(6) Existence of Non-Emitting Portion

An organic EL panel for evaluation was prepared and a lighting test was made on this panel at a screen brightness of 100 cd/m$^2$ {(Red: 100+Green: 200+Blue: 100) cd/m$^2$÷3×0.7≈100 cd/m$^2$} to check the existence of a non-emitting portion with the eye. The result is shown in Table 1.

(7) Luminance Half-Life Period

An organic EL panel for evaluation was prepared and a lightening promotion test was made on this panel at a screen brightness of 100 cd/m$^2$ {(Red: 100+Green: 200+Blue: 100) cd/m$^2$÷3×0.7≈100 cd/m$^2$} and a temperature of 105° C. The time elapsed until the screen brightness was halved is shown in Table 1. When this value is 400 hours or more, it can be said that luminance half-life period is satisfactory.

Examples 2 and 3

Composition solutions were prepared and evaluated in the same manner as in Example 1 except that the types and amounts of the components (a) and (b) were changed as shown in Table 1. The results are shown in Table 1.

TABLE 1

| | | Ex.1 | Ex.2 | Ex.3 |
|---|---|---|---|---|
| component (a) | type | resin 1 | resin 2 | resin 3 |
| | (amount) | (100) | (100) | (100) |
| component (b) | type | compound (i) | compound (ii) | compound (iii) |
| | (amount) | (30) | (25) | (20) |
| radiation sensitivity (mJ/cm$^2$) | | 100 | 125 | 100 |
| sectional form (tapered angle) | | 21° | 18° | 25° |
| existence of residue after development | | non-existent | non-existent | non-existent |
| water permeability (g/m$^2$) | | 450 | 500 | 470 |
| existence of non-emitting portion | | non-existent | non-existent | non-existent |
| luminance half-life period (h) | | 500 | 550 | 600 |

Ex.: Example

Examples 5 and 6

Composition solutions were prepared and evaluated in the same manner as in Example 4 except that the types and amounts of the components (a), (b) and (c) were changed as shown in Table 2. The results are shown in Table 2.

TABLE 2

|  |  | Ex.4 | Ex.5 | Ex.6 |
|---|---|---|---|---|
| component (a) | type | resin 3 | resin 1 | resin 2 |
|  | (amount) | (100) | (100) | (100) |
| component (b) | type | compound (i) | compound (ii) | compound (iii) |
|  | (amount) | (40) | (25) | (19) |
| component (c) | type | compound A | compound B (3) | compound C |
|  | (amount) | (1) | + | (5) |
|  |  |  | compound D (1) |  |
| radiation sensitivity (mJ/cm$^2$) |  | 120 | 120 | 100 |
| sectional form (tapered angle) |  | 12° | 15° | 10° |
| existence of residue after development |  | non-existent | non-existent | non-existent |
| water permeability (g/m$^2$) |  | 450 | 380 | 440 |
| existence of non-emitting portion |  | non-existent | non-existent | non-existent |
| luminance half-life period (h) |  | 700 | 600 | 650 |

Ex.: Example

The unit of the amount of each component is parts by weight. The compounds (i), (ii) and (iii) are the following compounds.

Compound (i): Condensate (1,1,3-tris(2,5-dimethyl-4-hydroxyphenyl)-3-phenylpropane-1,2-naphthoquinonediazide-5-sulfonate) of 1,3-tris(2,5-dimethyl-4-hydroxyphenyl)-3-phenylpropane (1.0 mol) and 1,2-naphthoquinonediazide-5-sulfonic acid chloride (1.9 mols)

Compound (ii): Condensate (4,4'-[1-[4-[1-[4-hydroxyphenyl]-1-methylethyl]phenyl] ethylidene]bisphenol-1,2-naphthoquinonediazide-5-sulfonate) of 4,4'-[1-[4-[1-[4-hydroxyphenyl]-1-methylethyl]phenyl] ethylidene]bisphenol (1.0 mol) and 1,2-naphthoquinonediazide-5-sulfonic acid chloride (2.0 mols)

Compound (iii): Condensate (2,3,4-hydroxybenzophenone-1,2-naphthoquinonediazide-5-sulfonate) of 2,3,4-hydroxybenzophenone (1.0 mol) and 1,2-naphthoquinonediazide-5-sulfonic acid chloride (2.0 mols)

Example 4

Preparation of Radiation Sensitive Resin Composition Containing Components (a), (b) and (c)

100 parts by weight of the resin 3 obtained in Synthesis Example 3 as the component (a), 40 parts by weight of a condensate (1,1,3-tris(2,5-dimethyl-4-hydroxyphenyl)-3-phenylpropane-1,2-naphthoquinonediazide-5-sulfonate) of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b) and 1 part by weight of N,N-dimethylpyridine as the component (c) were mixed together, the resulting mixture was diluted with and dissolved in methyl 3-methoxypropionate to a solids content of 30 wt %, and the resulting solution was filtered with a membrane filter having an opening diameter of 0.2 μm to prepare a composition solution.

The above composition solution was evaluated for radiation sensitivity, sectional form, existence of the residue after development, water permeability, existence of a non-emitting portion and luminance half-life period in the same manner as in Example 1. The results are shown in Table 2.

In Table 2, the unit of the amount of each component is parts by weight. The compounds (i), (ii) and (iii) are the same as in Table 1 and compounds A, B, C and D are the following compounds.

compound A: N,N-dimethylpyridine
compound B: triphenylamine
compound C: triactylamine
compound D: nicotinamide

Example 7

Preparation of Radiation Sensitive Resin Composition Containing Components (a), (b) and (d)

100 parts by weight of the resin 2 obtained in Synthesis Example 2 as the component (a), 30 parts by weight of a condensate (1,1,3-tris(2,5-dimethyl-4-hydroxyphenyl)-3-phenylpropane-1,2-naphthoquinonediazide-5-sulfonate) of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b) and 25 parts by weight of Cymel 300 (of Mitsui Cyanamid Co., Ltd.) as the component (d) were mixed together, the resulting mixture was diluted with and dissolved in methyl 3-methoxypropionate to a solids content of 30 wt %, and the resulting solution was filtered with a membrane filter having an opening diameter of 0.2 μm to prepare a composition solution.

The procedure of Example 1 was repeated using the above composition solution to evaluate radiation sensitivity, sectional form, existence of the residue after development, water permeability, existence of a non-emitting portion and luminance half-life period. The results are shown in Table 3.

(8) Evaluation of Alkali Resistance

The glass substrate having the patterned thin film formed thereon was immersed in a 1% NaOH aqueous solution whose temperature was controlled to 25° C. for 20 minutes. The ratio of the film thicknesses before and after immersion (t1/T1)×100 [%] was calculated in which the film thickness before immersion was represented by T1 and the film thickness after immersion was represented by t1. The result is shown in Table 3. When this value is 95 to 105%, it can be said that alkali resistance is satisfactory.

(9) Evaluation of Solvent Resistance

The glass substrate having the patterned thin film formed thereon was immersed in a mixed solution of dimethyl sulfoxide/N-methylpyrrolidone (weight ratio of 70/30) whose temperature was controlled to 25° C. for 20 minutes. The ratio of film thicknesses before and after immersion $(t2/T2)\times100$ (%) was calculated in which the film thickness before immersion was represented by T2 and the film thickness after immersion was represented by t2. The result is shown in Table 3. When this value is 95 to 105%, it can be said that solvent resistance is satisfactory.

(10) Evaluation of Heat Resistance

The glass substrate having the patterned thin film formed thereon was additionally baked at 220° C. for 60 minutes. The ratio of film thicknesses before and after additional baking $(t3/T3)\times100$ (%) was calculated in which the film thickness before additional baking was represented by T3 and the film thickness after additional baking was represented by t3. The result is shown in Table 3. When this value is 95 to 105%, it can be said that heat resistance is satisfactory.

Examples 8 and 9

Composition solutions were prepared and evaluated in the same manner as in Example 7 except that the types and amounts of the components (a), (b) and (d) were changed as shown in Table 3. The results are shown in Table 3.

of Cymel 300 (of Mitsui Cyanamid Co., Ltd., melamine compound) as the component (d) were mixed together, the resulting mixture was diluted with and dissolved in methyl 3-methoxypropionate to a solids content of 30 wt %, and the obtained solution was filtered with a membrane filter having an opening diameter of 0.2 μm to prepare a composition solution.

The above composition solution was evaluated for radiation sensitivity, sectional form, existence of the residue after development, water permeability, alkali resistance, solvent resistance, heat resistance, existence of a non-emitting portion and luminance half-life period in the same manner as in Example 7. The results are shown in Table 4.

Examples 11 and 12

Composition solutions were prepared and evaluated in the same manner as in Example 10 except that the types and amounts of the components (a), (b), (c) and (d) were changed as shown in Table 4. The results are shown in Table 4.

TABLE 3

|  |  | Ex.7 | Ex.8 | Ex.9 |
|---|---|---|---|---|
| component (a) | type | resin 2 | resin 3 | resin 1 |
|  | (amount) | (100) | (100) | (100) |
| component (b) | type | compound (i) | compound (ii) | compound (iii) |
|  | (amount) | (30) | (25) | (16) |
| component (c) | type | melamine α | epoxy α | melamine β |
|  | (amount) | (25) | (15) | (40) |
| radiation sensitivity (mJ/cm$^2$) |  | 120 | 120 | 100 |
| sectional form (tapered angle) |  | 9° | 7° | 10° |
| alkali resistance (%) |  | 101 | 102 | 102 |
| solvent resistance (%) |  | 103 | 103 | 101 |
| heat resistance (%) |  | 99 | 99 | 99 |
| existence of residue after development |  | non-existent | non-existent | non-existent |
| water permeability (g/m$^2$) |  | 430 | 380 | 340 |
| existence of non-emitting portion |  | non-existent | non-existent | non-existent |
| luminance half-life period (h) |  | 550 | 650 | 700 |

Ex.: Example

In Table 3, the unit of the amount of each component is parts by weight, compounds (i), (ii) and (iii) are the same as in Table 1, and melamine α, melamine β and epoxy α are the following compounds.

melamine α: Cymel 300 of Mitsui Cyanamid Co., Ltd.
melamine β: Cymel 370 of Mitsui Cyanamid Co., Ltd.
epoxy α: Epicoat 152 of Yuka Shell Epoxy Co., Ltd.

Example 10

Preparation of Radiation Sensitive Resin Composition Containing Components (a), (b), (c) and (d)

100 parts by weight of the resin 1 obtained in Synthesis Example 1 as the component (a), 45 parts by weight of a condensate (1,1,3-tris(2,5-dimethyl-4-hydroxyphenyl)-3-phenylpropane-1,2-naphthoquinonediazide-5-sulfonate) of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b), 5 parts by weight of nicotinamide as the component (c) and 30 parts by weight

TABLE 4

|  |  | Ex.10 | Ex.11 | Ex.12 |
|---|---|---|---|---|
| component (a) | type | resin 2 | resin 3 | resin 1 |
|  | (amount) | (100) | (100) | (100) |
| component (b) | type | compound (i) | compound (ii) | compound (iii) |
|  | (amount) | (30) | (25) | (16) |
| component (c) | type | compound D | compound A | compound |
|  | (amount) | (5) | (8) | (2) |
| component (d) | type | melamine α | epoxy β (5) | melamine α |
|  | (amount) | (30) | + | (50) |
|  |  |  | melamine γ (15) |  |
| radiation sensitivity (mJ/cm$^2$) |  | 150 | 120 | 90 |
| sectional form (tapered angle) |  | 7° | 10° | 7° |
| alkali resistance (%) |  | 101 | 102 | 103 |
| solvent resistance (%) |  | 102 | 101 | 102 |
| heat resistance (%) |  | 99 | 99 | 98 |
| existence of residue after development |  | non-existent | non-existent | non-existent |
| water permeability (g/m$^2$) |  | 420 | 380 | 300 |
| existence of non-emitting portion |  | non-existent | non-existent | non-existent |
| luminance half-life period (h) |  | 650 | 700 | 700 |

Ex.: Example

In Table 3, the unit of the amount of each component is parts by weight, compounds (i), (ii) and (iii) are the same as in Table 1, the compounds A, B and D are the same as in Table 2, melamine α, melamine β and epoxy α are the same as in Table 3, and melamine γ and epoxy β are the following compounds.

melamine γ: Cymel 303 of Mitsui Cyanamid Co., Ltd.
epoxy β: Epicoat 154 of Yuka Shell Epoxy Co., Ltd.

Example 13

Preparation of Radiation Sensitive Resin Composition 100 parts by weight of the resin 4 obtained in Synthesis Example 4 as the component (a), 30.0 parts by weight of a condensate of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b), 1.0 part by weight of nicotinamide as the component (c) and 30.0 parts by weight of Cymel 300(of Mitsui Cyanamid Co., Ltd.) were mixed together, the resulting mixture was diluted with and dissolved in methyl 3-methoxypropionate to a total solids content of 40%, and the obtained solution was filtered with a membrane filter having an opening diameter of 0.1 μm to prepare a composition solution.

Formation of Patterned Thin Film

The composition solution prepared above was applied to a glass substrate to a film thickness of 1.0 μm with a spin coater and pre-baked on a hot plate at 80° C. for 1.5 minutes. The coating film was then exposed to light (exposure: 200 mJ/cm$^2$ of ghi mixed-rays) using the NSR1755i7A reduction projection exposure tool (NA=0.50, λ=365 nm) of Nikon Corporation and developed with an aqueous solution of tetramethylammonium hydroxide at 25° C. for 1 minute. Thereafter, the developed coating film was washed with running water and dried to form a pattern on the wafer. Then, the pattern was exposed to 600 mJ/cm$^2$ of ultraviolet radiation which was ghi mixed-ray and heated in an oven at 200° C. for 60 minutes to form a patterned thin film.

The patterned thin film formed above was evaluated as follows.

Figure 1:
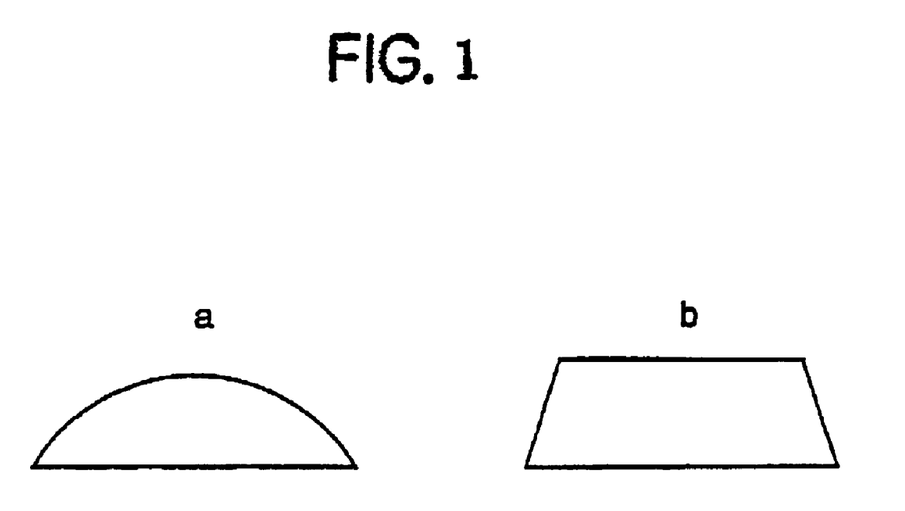
FIG. 1 is a schematic diagram for judging whether the sectional form of a patterned thin film is good or not.

(1) Pattern Shape: The sectional form of the patterned thin film formed above was observed by a scanning electron microscope to be judged according to FIG. 1. FIG. 1(a) shows a good sectional form and FIG. 1(b) shows a bad sectional form. The result is shown in Table 5.

(2) Alkali Resistance: The glass substrate having the patterned thin film formed thereon was immersed in a 1% NaOH aqueous solution whose temperature was controlled to 25° C. for 20 minutes to calculate (t1/T1)×100 (%) as an index for a change in film thickness by immersion in which the film thickness before immersion was represented by T1 and the film thickness after immersion was represented by t1. This value is shown in Table 5. When this value is 98 to 103%, it can be said that alkali resistance is satisfactory.

(3) Heat Resistance: The glass substrate having the patterned thin film formed thereon was additionally baked at 220° C. for 60 minutes. (t2/T2)×100 (%) in which the film thickness before additional baking was represented by T2 and the film thickness after additional baking was represented by t2 was calculated as an index for a change in film thickness by additional baking. This value is shown in Table 5. When this value is 95 to 100%, it can be said that heat resistance is satisfactory.

(4) Luminance Half-Life Period of Evaluation Element: An organic EL panel for evaluation was prepared and a lighting test was made on this panel at a screen brightness of 100 cd/m$^2$ {(Red: 100+Green: 200+Blue: 100) cd/m$^2$÷3×0.7 ≈100 cd/m$^2$}. The time elapsed until the brightness of the screen was halved is shown in Table 1. When this value is 10,000 hours or more, it can be said that luminance half-life period is satisfactory.

Examples 14 to 22 and Comparative Examples 1 and 2

Radiation sensitive resin compositions were prepared in the same manner as in Example 13 except that the components (a), (b), (c) and (d) were changed as shown in Table 5 to form and evaluate patterned thin films. The results are shown in Table 5.

Symbols representing the components (a), (b), (c) and (d) in Table 5 denote the following components. The amounts in Table 5 are all parts by weight in terms of solid matter.

(a) Alkali-Soluble Resin
  resin 11: PHM-C {resin prepared by reducing Markalinker M (polyhydroxystyrene, Mw=4,000 to 6,000)} of Maruzen Petrochemical Co., Ltd.

(b) 1,2-quinonediazide Compound
  compound B(1): condensate of 1,1,3-tris(2,5-dimethyl-4-hydroxyphenyl)-3-phenylpropane (1.0 mol) and 1,2-naphthoquinonediazide-5-sulfonic acid chloride (1.9 mols)
  compound B(2): condensate of 4,4'-[1-[4-[1-[4-hydroxyphenyl]-1-methylethyl]phenyl] ethylidene] bisphenol (1.0 mol) and 1,2-naphthoquinonediazide-5-sulfonic acid chloride (2.0 mols)

(c) Basic Nitrogen-Containing Compound
compound C(1):nicotinamide
compound C(2): triphenylamine
compound C(3): 2-(4-aminophenyl)-2-(4-hydroxyphenyl)propane
compound C(4): polyethyleneimine
compound C(5): 4-methylpyrrolidone
compound C(6): 4-methylimidazole
compound C(7): 1,3-diphenylurea
compound C(8): piperazine
compound C(9): poly(4-vinylpyridine)
(d) Melamines
compound D(1): Cymel 300 of Mitsui Cyanamid Co., Ltd.
compound D(2): Cymel 370 of Mitsui Cyanamid Co., Ltd.
compound D(3): Cymel 303 of Mitsui Cyanamid Co., Ltd.

termined pattern mask and developed with an aqueous solution of tetramethylammonium hydroxide at 25° C. for 1 minute. The coating film was then washed with running water and dried to form a pattern on the wafer. Thereafter, the coating film was exposed to 300 mJ/cm² of ultraviolet radiation which was ghi mixed-rays from the Aligner PLA501F of Canon Inc. and heated in an oven at 220° C. for 60 minutes to form a 1.0 μm thick patterned thin film.

(1) Generation of Scum (Observation through an Optical Microscope)

When the above obtained patterned thin film was observed through an optical microscope, there was no scum and a 5.0 μm square through hole was formed.

(2) Evaluation of Transparency

The light transmission of the above glass substrate having the 1.0 μm thick patterned thin film formed thereon was

TABLE 5

|  | amount of component (a) | amount of component (b) | amount of component (c) | amount of component (d) | pattern shape | alkali resistance (%) | heat resistance (%) | luminance half-life period (h) |
|---|---|---|---|---|---|---|---|---|
| Ex.13 | resin 4 100 | B(1) 30 | C(1) 1 | D(1) 30 | satisfactory | 101 | 99 | 15,000 |
| Ex.14 | resin 4 100 | B(2) 12 | C(2) 1 | D(1) 30 | satisfactory | 101 | 98 | 15,000 |
| Ex.15 | resin 5 100 | B(1) 45 | C(3) 1 | D(1) 30 | satisfactory | 102 | 99 | 15,000 |
| Ex.16 | resin 5 100 | B(2) 30 | C(4) 0.05 | D(1) 30 | satisfactory | 101 | 99 | 15,000 |
| Ex.17 | resin 6 100 | B(1) 30 | C(5) 20 | D(1) 30 | satisfactory | 100 | 98 | 15,000 |
| Ex.18 | resin 7 100 | B(1) 30 | C(6) 1 | D(1) 10 | satisfactory | 101 | 99 | 15,000 |
| Ex.19 | resin 11 100 | B(1) 30 | C(7) 1 | D(1) 50 | satisfactory | 101 | 98 | 15,000 |
| Ex.20 | resin 9 100 | B(1) 40 | C(8) 10 | D(3) 40 | satisfactory | 101 | 99 | 15,000 |
| Ex.21 | resin 4 100 | B(1) 15 | C(9) 0.1 | D(2) 20 | satisfactory | 101 | 99 | 15,000 |
| Ex.22 | resin 4/resin 7 100/40 | B(1) 30 | C(9) 1 | D(2) 30 | satisfactory | 102 | 98 | 15,000 |
| C.Ex.1 | resin 4 100 | B(2) 30 | nil | nil | unsatisfactory | 75 | 93 | 5,000 |
| C.Ex.2 | resin 10 100 | B(2) 30 | C(8) 10 | nil | unsatisfactory | 76 | 92 | 5,000 |

Ex.: Example
C.Ex.: Comparative Example

Example 23
Preparation of Radiation Sensitive Resin Composition 333 parts by weight of a solution containing the resin 11 obtained in Synthesis Example 11 as the component (a) (corresponding to 100 parts by weight (solid content) of the resin 11) and 30.0 parts by weight of a condensate (1,1,3-tris(2,5-dimethyl-4-hydroxyphenyl)-3-phenylpropane-1,2-naphthoquinonediazide-5-sulfonate) of 1,1,3-tris(2,5-dimethyl-4-hydroxyphenyl)-3-phenylpropane (1.0 mol) and 1,2-naphthoquinonediazide-5-sulfonic acid chloride (1.9 mols) as the component (b) were mixed together, the resulting mixture was diluted with and dissolved in propylene glycol methyl ether acetate to a total solids content of 30%, and the resulting solution was filtered with a membrane filter having an opening diameter of 0.2 μm to prepare a composition solution.

Formation of Patterned Thin Film (Insulating Film)

The composition solution prepared above was applied to a glass substrate to a thickness of 1.2 μm with a spin coater and prebaked on a hot plate at 80° C. of 1.5 minutes to form a coating film. This coating film was exposed to light with the NSR1755i7A reduction projection exposure tool of Nikon Corporation (NA=0.50, λ=365 nm) through a predemeasured with the 150-20 double beam spectrophotometer (of Hitachi, Ltd.). The minimum transmission at a wavelength range of 400 to 700 nm is shown in Table 6. When this value is 80% or more, it can be said that transparency is satisfactory.

(3) Evaluation of Alkali Resistance

The glass substrate having the patterned thin film formed thereon was immersed for 20 minutes in a 1% NaOH aqueous solution whose temperature was controlled to 25° C. The ratio of film thicknesses before and after immersion (t1/T1)×100 (%) in which the film thickness before immersion was represented by T1 and the film thickness after immersion was represented by t1 was calculated. This result is shown in Table 6. When this value is 95 to 105%, it can be said that alkali resistance is satisfactory.

(4) Evaluation of Solvent Resistance

The glass substrate having the patterned thin film formed thereon was immersed for 20 minutes in a mixed solution of dimethyl sulfoxide/N-methylpyrrolidone (weight ratio of 70/30) whose temperature was controlled to 25° C. The ratio of film thicknesses before and after immersion (t2/T2)×100 (%) in which the film thickness before immersion was represented by T2 and the film thickness after immersion was represented by t2 was calculated. This result is shown in Table 6. When this value is 95 to 105%, it can be said that solvent resistance is satisfactory.

(5) Evaluation of Heat Resistance

The glass substrate having the patterned thin film formed thereon was additionally baked at 220° C. for 60 minutes. The ratio of film thicknesses before and after additional baking (t3/T3)×100 (%) in which the film thickness before additional baking was represented by T3 and the film thickness after additional baking was represented by t3 was calculated. This result is shown in Table 6. When this value is 95 to 105%, it can be said that heat resistance is satisfactory.

(6) Evaluation of Flattening Performance

The above composition was applied to a silicon wafer substrate having an aluminum pattern having a line width of 20 μm and a space width of 80 μm to a thickness of 1 μm. Thereafter, the substrate was prebaked at 80° C. for 1.5 minutes, exposed to 300 mJ/cm² of ultraviolet radiation which was ghi mixed-rays from the Aligner PLA501F of Canon Inc., and heated at 220° C. for 60 minutes to form an insulating film. The surface roughness of the formed insulating film was measured with the α-step (of KLA Tencol Co., Ltd.). The maximum surface unevenness is shown in Table 6. When this value is 0.2 μm or less, it can be said that flattening performance is satisfactory.

(7) Luminance Half-Life Period

An organic EL panel for evaluation was produced and a lighting promotion test was made on the panel at a screen brightness of 100 cd/m² {(Red: 100+Green: 200+Blue: 100) cd/m²÷3×0.7≈100 cd/m²} and a temperature of 105° C. The time elapsed until the screen brightness was halved is shown in Table 6. When this value is 400 hours or more, it can be said that luminance half-life period is satisfactory.

Example 24

A composition solution was prepared and evaluated in the same manner as in Example 23 except that 333 parts by weight of a solution containing the resin 12 prepared in Synthesis Example 12 (corresponding to 100 parts by weight (solid content) of the resin 12) as the component (a) and 25 parts by weight of a condensate
(4,4'-[1-[4-[1-[4-hydroxyphenyl]-1-methylethyl]phenyl]ethylidene]bisphenol-1,2-naphthoquinonediazide-5-sulfonate) of
4,4'-[1-[4-[1-[4-hydroxyphenyl]-1-methylethyl]phenyl]ethylidene]bisphenol (1.0 mol) and
1,2-naphthoquinonediazide-5-sulfonic acid chloride (2.0 mols) as the component (b) were used. The results are shown in Table 6.

Example 25

A composition solution was prepared and evaluated in the same manner as in Example 23 except that 333 parts by weight of a solution containing the resin 13 prepared in Synthesis Example 13 (corresponding to 100 parts by weight (solid content) of the resin 13) as the component (a) and 20 parts by weight of a condensate (2,3,4-hydroxybenzophenone-1,2-naphthoquinonediazide-5-sulfonate) of 2,3,4-hydroxybenzophenone (1.0 mol) and 1,2-naphthoquinonediazide-5-sulfonic acid chloride (2.0 mols) as the component (b) were used. The results are shown in Table 6.

Example 26

A composition solution was prepared and evaluated in the same manner as in Example 23 except that the amount of the component (b) was changed to 40 parts by weight. The results are shown in Table 6.

TABLE 6

|  | Ex.23 | Ex.24 | Ex.25 | Ex.26 |
| --- | --- | --- | --- | --- | --- |
| generation of scum | no scum existent | no scum existent | no scum existent | no scum existent |
| 5.0 μm square through hole transparency (%) (minimum transmission at 400 to 700 nm) | 92 | 91 | 95 | 92 |
| alkali resistance (%) | 102 | 104 | 101 | 103 |
| solvent resistance (%) | 103 | 102 | 101 | 102 |
| heat resistance (%) | 99 | 99 | 99 | 99 |
| flattening performance (μm) | 0.17 | 0.20 | 0.18 | 0.19 |
| luminance half-life period (h) | 700 | 650 | 700 | 760 |

Ex.: Example

EFFECT OF THE INVENTION

According to the present invention, there are provided an insulating film for an organic EL element, which has sufficiently low water permeability and a good sectional form and whose reactivity with a basic material and an electrode made from a metal having a low work function is suppressed, and a radiation sensitive resin composition (first composition) for forming the insulating film.

According to the present invention, there are also provided an insulating film for an organic EL element, which enables the formation of a through hole or U-shaped cavity therein and has excellent flattening performance high transparency, and high resistance to a resist stripper, and a radiation sensitive resin composition (second composition) for forming the insulating film.

The organic EL display element of the present invention has no emission failure, sufficiently long luminance half-life period and excellent reliability.

What is claimed is:

1. A method for producing an organic EL display element, comprising
   forming an insulating layer from a radiation sensitive composition comprising an alkali-soluble resin having no epoxy group, a 1,2-quinonediazide compound, and at least one compound selected from the voup consisting of a melaniine compound and an epoxy compound overlying a substrate, and
   forming an organic EL emitting layer overlying the insulating layer.

2. The method of claim 1, wherein the alkali-soluble resin is a novolak resin having no epoxy group.

3. The method of claim 1, wherein the alkali-soluble resin is a copolymer having no epoxy group of(1a) at least one unsaturated monomer selected from the group consisting of an unsaturated carboxylic acid, unsaturated carboxylic anhydiide and phenolic hydroxyl group-containing unsaturated monomer, and (2a) an olefmic unsaturated monomer other than unsaturated monomer (1a).

4. The method of claim 1, wherein said composition comprises a melamine compound.

5. The method of claim 1, wherein said composition comprises an epoxy compound.

6. The method of claim 1, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

7. The method of claim 6, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazjdesulfonamide, and 1,2-naphthoquinonediazidesulfonamide and wherein the alkali-soluble resin is a copolymer having no epoxy group of (1a) at least one unsaturated monomer selected from the group consisting of an unsaturated carboxylic acid, unsaturated carboxylic anhydride and phenolic hydroxyl group-containing unsaturated monomer, and (2a) an olefinic unsaturated monomer other than unsaturated monomer (1a).

8. The method of claim 5, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide and wherein the alkali-soluble resin is a copolymer having no epoxy group of (1a) at least one unsaturated monomer selected from the group consisting of an unsaturated carboxylic acid, unsaturated carboxylic anhydride and phenolic hydroxyl group-containing unsaturated monomer, and (2a) an olefinic unsaturated monomer other than unsaturated monomer (1a).

9. An organic EL display element comprising an organic EL emitting layer and an insulating film formed from a radiation sensitive composition comprising an alkali-soluble resin having no epoxy group, a 1,2-quinonediazide compound, and at least one compound selected from the group consisting of a melamine compound and an epoxy compound.

10. The element of claim 9, wherein the alkali-soluble resin is a novolak resin having no epoxy group.

11. The element of claim 9, wherein the alkali-soluble resin is a copolymer having no epoxy group of (1a) at least one unsaturated monomer selected from the group consisting of an unsaturated carboxylic acid, unsaturated carboxylic anhydride and phenolic hydroxyl group-containing unsaturated monomer, and (2a) an olefinic unsaturated monomer other than unsaturated monomer (1a).

12. The element of claim 9, wherein said composition comprises a melamine compound.

13. The element of claim 9, wherein said composition comprises an epoxy compound.

14. The element of claim 9, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

15. The element of claim 12, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide and wherein the alkali-soluble resin is a copolymer having no epoxy group of (1a) at least one unsaturated monomer selected from the group consisting of an unsaturated carboxylic acid, unsaturated carboxylic anhydride and phenolic hydroxyl group-containing unsaturated monomer, and (2a) an olefinic unsaturated monomer other than unsaturated monomer (1a).

16. The element of claim 13, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide and wherein the alkali-soluble resin is a copolymer having no epoxy group of (1a) at least one unsaturated monomer selected from the group consisting of an unsaturated carboxylic acid, unsaturated carboxylic anhydride and phenolic bydroxyl group-containing unsaturated monomer, and (2a) an olefinic unsaturated monomer other than unsaturated monomer (1a).

17. A method for producing an organic EL display element, comprising forming an insulating layer from a radiation sensitive composition comprising (a') an alkali-soluble resin having an epoxy group and (b) a 1,2-quinonediazide compound overlying a substrate, and forming an organic EL emitting layer overlying the insulating layer.

18. The method of claim 17, wherein the alkali-soluble resin having an epoxy group is a copolymer having an epoxy group of (1a) an unsaturated monomer having an epoxy group, (2a) at least one unsaturated monomer selected from the group consisting of an unsaturated carboxylic acid, unsaturated carboxylic anhydride and phenolic hydroxyl group-containing unsaturated monomer, and (3a) an olefinic unsaturated monomer other than unsaturated monomers (1a) and (2a).

19. The method of claim 17, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

20. The method of claim 18, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

21. An organic EL display element comprising an organic EL emitting layer and an insulating film formed from a composition comprising an alkali-soluble resin having no epoxy group and a 1,2-quinonediazide compound.

22. The element of claim 21, wherein the alkali-soluble resin having an epoxy group is a copolymer having an epoxy group of (1a) an unsaturated monomer having an epoxy group, (2a) at least one unsaturated monomer selected from the group consisting of an unsaturated carboxylic acid, unsaturated carboxylic anhydride and phenolic hydroxyl group-containing unsaturated monomer, and (3a) an olefinic unsaturated monomer other than unsaturated monomers (1a) and (2a).

23. The element of claim 21, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

24. The element of claim 22, wherein said 1,2-quinonediazide compound is selected from the group consisting of a 1,2-benzoquinonediazidesulfonic acid ester, 1,2-naphthoquinonediazidesulfonic acid ester, 1,2-benzoquinonediazidesulfonamide, and 1,2-naphthoquinonediazidesulfonamide.

25. The method of claim 1, wherein said radiation sensitive composition further comprises (c) a basic nitrogen-containing compound.

26. The element of claim 9, wherein said radiation sensitive composition further comprises (c) a basic nitrogen-containing compound.

* * * * *